(12) United States Patent
Yamazaki et al.

(10) Patent No.: US 8,009,145 B2
(45) Date of Patent: Aug. 30, 2011

(54) DISPLAY DEVICE AND AN ELECTRONIC APPARATUS USING THE SAME

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 627 days.

(21) Appl. No.: 11/969,232

(22) Filed: Jan. 4, 2008

(65) Prior Publication Data

US 2008/0174514 A1 Jul. 24, 2008

Related U.S. Application Data

(62) Division of application No. 10/799,756, filed on Mar. 15, 2004, now Pat. No. 7,327,335.

(30) Foreign Application Priority Data

Apr. 9, 2003 (JP) ................................. 2003-105923
Apr. 11, 2003 (JP) ................................. 2003-108484

(51) Int. Cl.
*G09G 5/00* (2006.01)
*G09G 3/30* (2006.01)
(52) U.S. Cl. .................. 345/169; 345/4; 345/5; 345/76; 345/156; 345/168
(58) Field of Classification Search ................... 345/1.1, 345/1.2, 4, 5, 76, 84, 156, 168, 169
See application file for complete search history.

(56) References Cited

U.S. PATENT DOCUMENTS

| 4,665,278 | A | 5/1987 | Takada |
| 5,304,895 | A | 4/1994 | Ujihara |
| 5,703,436 | A | 12/1997 | Forrest |
| 5,896,575 | A | 4/1999 | Higginbotham |
| 6,280,559 | B1 | 8/2001 | Terada |
| 6,388,377 | B1 | 5/2002 | Kobayashi et al. |
| 6,392,340 | B2 | 5/2002 | Yoneda |
| 6,466,202 | B1 | 10/2002 | Suso |
| 6,466,292 | B1 | 10/2002 | Kim |
| 6,489,631 | B2 | 12/2002 | Young et al. |
| 6,574,487 | B1 | 6/2003 | Smith |
| 6,580,488 | B2 | 6/2003 | Kim |

(Continued)

FOREIGN PATENT DOCUMENTS

CA          2406411 A1    10/2001

(Continued)

OTHER PUBLICATIONS

European Patent Office Search Report (European Patent Application 04008438.6), dated Feb. 1, 2008, 6 pages.

(Continued)

*Primary Examiner* — My-Chau T Tran
(74) *Attorney, Agent, or Firm* — Fish & Richardson P.C.

(57) ABSTRACT

In a conventional display device comprising a sub-display, the display device is increased in thickness and in the number of components as the number of displays is increased. In the present invention, a dual emission display device is used so that either surface of a display is used as a main display or a sub-display. Accordingly, the display device can be reduced in thickness and in the number of components. Further, mechanical reliability can be enhanced when the invention is applied to a tablet PC, a video camera and the like.

9 Claims, 24 Drawing Sheets

U.S. PATENT DOCUMENTS

| | | | |
|---|---|---|---|
| 6,583,770 B1 | 6/2003 | Antila | |
| 6,697,083 B1* | 2/2004 | Yoon | 345/658 |
| 6,747,609 B2 | 6/2004 | Antila et al. | |
| 6,801,185 B2 | 10/2004 | Salley | |
| 6,812,989 B2 | 11/2004 | Kim | |
| 6,819,309 B1 | 11/2004 | Kishi | |
| 6,907,276 B2* | 6/2005 | Toba | 455/566 |
| 7,012,365 B2 | 3/2006 | Adachi et al. | |
| 7,034,451 B2 | 4/2006 | Senbonmatsu | |
| 7,043,276 B2* | 5/2006 | Kokubo | 455/566 |
| 7,149,781 B2 | 12/2006 | Aoyama | |
| 7,195,826 B2 | 3/2007 | Kido et al. | |
| 7,199,520 B2* | 4/2007 | Fujii et al. | 313/506 |
| 7,221,092 B2* | 5/2007 | Anzai et al. | 313/506 |
| 7,339,316 B2 | 3/2008 | Adachi et al. | |
| RE40,204 E* | 4/2008 | Yamamoto | 361/679.27 |
| 7,389,326 B2 | 6/2008 | Aoyama | |
| 7,430,025 B2* | 9/2008 | Okamoto et al. | 349/56 |
| 7,532,173 B2* | 5/2009 | Yamazaki et al. | 345/1.1 |
| 7,750,552 B2* | 7/2010 | Yamazaki et al. | 313/506 |
| 2001/0048982 A1 | 12/2001 | Kido et al. | |
| 2002/0063518 A1* | 5/2002 | Okamoto et al. | 313/506 |
| 2002/0079833 A1 | 6/2002 | Kobayashi et al. | |
| 2002/0093284 A1 | 7/2002 | Adachi et al. | |
| 2002/0111195 A1 | 8/2002 | Kweon | |
| 2002/0158999 A1 | 10/2002 | Shima | |
| 2003/0189528 A1 | 10/2003 | Antila | |
| 2003/0193288 A1 | 10/2003 | Pavlovsky | |
| 2004/0226200 A1 | 11/2004 | Salley | |
| 2005/0070334 A1* | 3/2005 | Ono et al. | 455/566 |
| 2007/0164257 A1 | 7/2007 | Kido et al. | |
| 2008/0143253 A1 | 6/2008 | Adachi et al. | |
| 2009/0058277 A1 | 3/2009 | Kido et al. | |

FOREIGN PATENT DOCUMENTS

| | | |
|---|---|---|
| CN | 1200526 | 12/1998 |
| CN | 1237318 | 12/1999 |
| CN | 1247675 A | 3/2000 |
| EP | 0 881 617 | 12/1998 |
| EP | 0 969 701 | 1/2000 |
| EP | 1 223 618 A2 | 7/2002 |
| GB | 2 349 784 | 11/2000 |
| GB | 2 364 462 | 1/2002 |
| GB | 2 376 616 | 12/2002 |
| JP | 08-185984 A | 7/1996 |
| JP | 10-123985 A | 5/1998 |
| JP | 11-321384 A | 11/1999 |
| JP | 2001-027756 A | 1/2001 |
| JP | 2001-051251 A | 2/2001 |
| JP | 2001-086205 | 3/2001 |
| JP | 2001-184000 A | 7/2001 |
| JP | 2001-285445 | 10/2001 |
| JP | 2001-298519 A | 10/2001 |
| JP | 2001-305525 A | 10/2001 |
| JP | 2001-332392 A | 11/2001 |
| JP | 2001-345184 A | 12/2001 |
| JP | 2001-356714 A | 12/2001 |
| JP | 2002-025779 A | 1/2002 |
| JP | 2002-215067 A | 7/2002 |
| JP | 2002-252089 A | 9/2002 |
| JP | 2002-296375 A | 10/2002 |
| JP | 2002-372929 A | 12/2002 |
| JP | 2002-373792 A | 12/2002 |
| JP | 2003-021836 A | 1/2003 |
| JP | 2003-036974 A | 2/2003 |
| JP | 2003-044207 A | 2/2003 |
| JP | 2003-086376 A | 3/2003 |
| JP | 2003-098545 A | 4/2003 |
| JP | 3408154 | 5/2003 |
| WO | WO 98/38822 | 9/1998 |
| WO | 01/80204 A2 | 10/2001 |

OTHER PUBLICATIONS

Fourth Office Action (Chinese Patent Application No. 200410033444.1) mailed Feb. 5, 2010 with full English translation.

Chinese Office Action (Chinese Application No. 200410033444), 23 pages, mailed May 30, 2008 with English translation.

Exhibition of Active Matrix Type Organic EL Display at "13$^{th}$ Flat Panel Display Manufacturing Technology Expo & Conference" by ELDis Group (*in Japanese with full translation*); Jul. 2, 2003.

Documents distributed in the "13$^{th}$ Flat Panel Display Manufacturing Technology Expo & Conference" by ELDis Group (5 pages), Jul. 2, 2003.

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

Kwan Hee Lee et al.; "9.3:2.2" QCIF Full Color Transparent AMOLED Display; *SID 03 Digest*; pp. 104-107; 2003.

Austrian Patent Office Search Report and Written Opinion (Singapore Application No. 200401210-0), dated Mar. 16, 2006, 9 pages.

Office Action, Korean Application No. 2004-0022000, dated Sep. 30, 2010, 7 pages with English translation.

\* cited by examiner

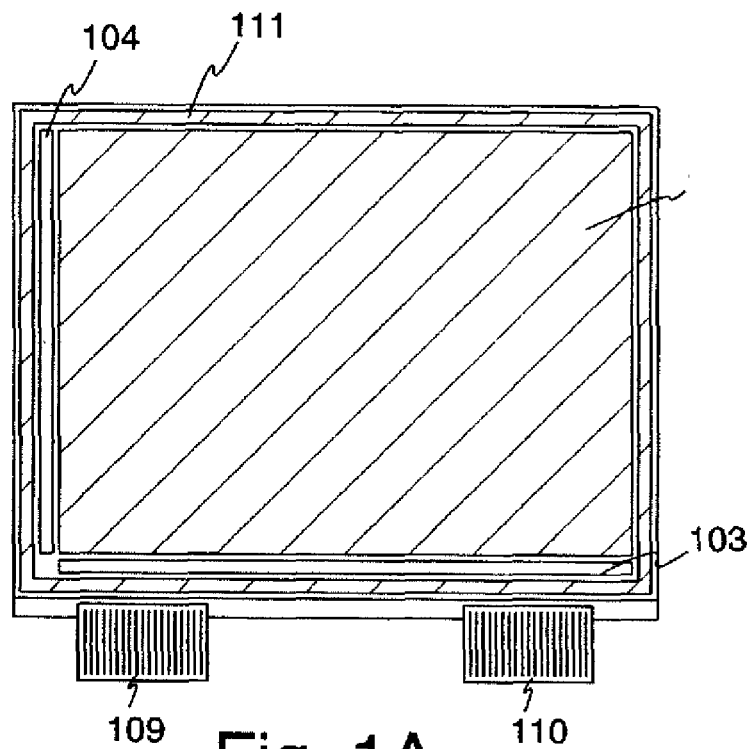
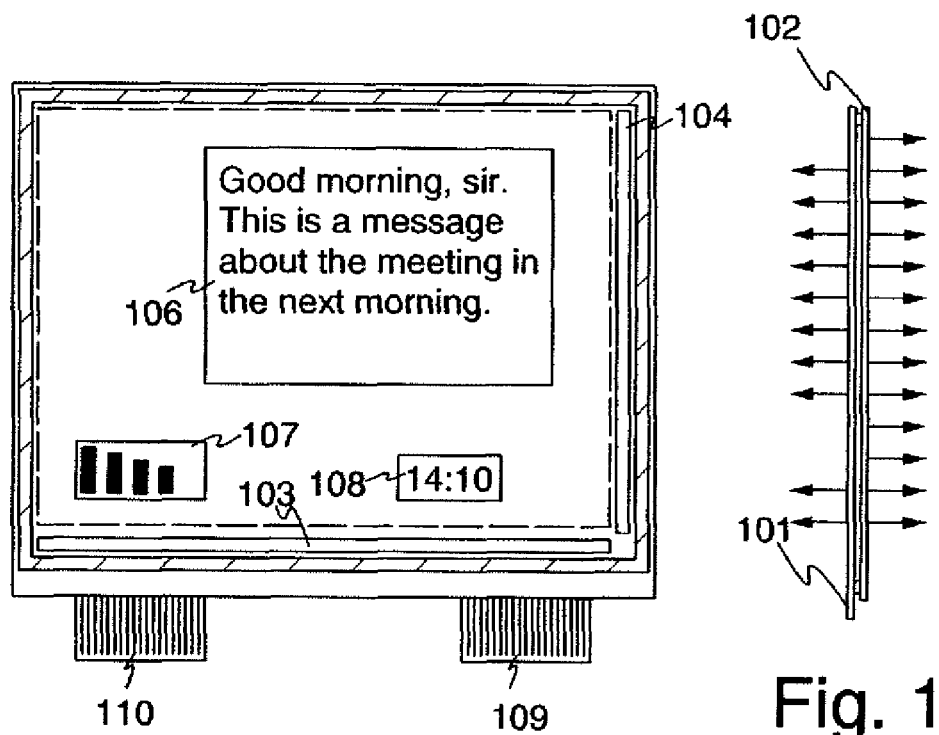

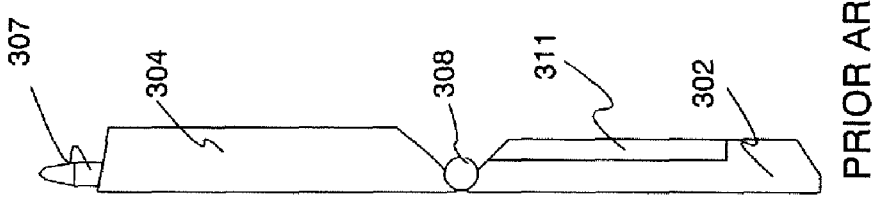
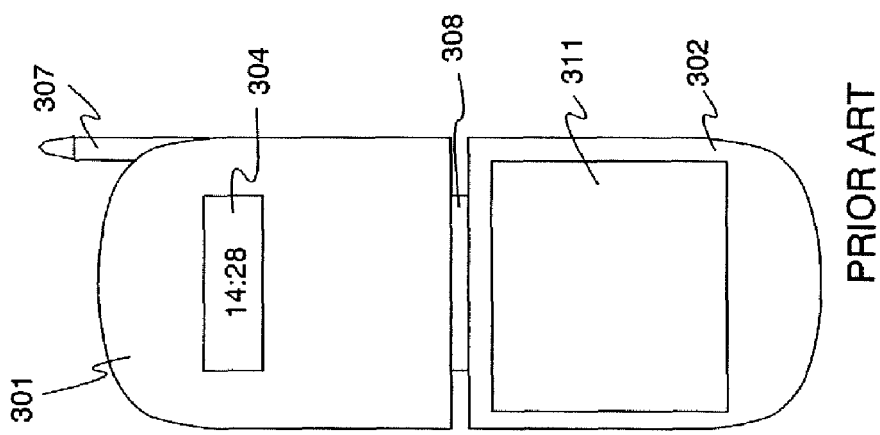
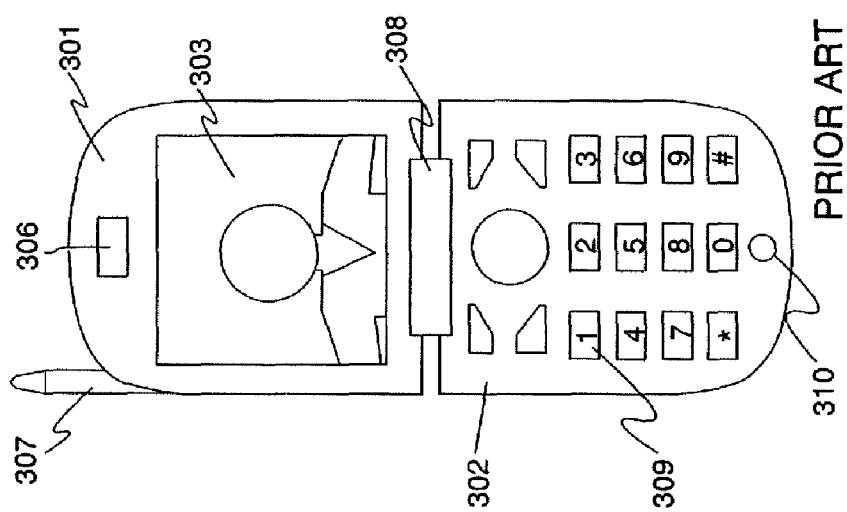
Fig. 3A PRIOR ART
Fig. 3B PRIOR ART
Fig. 3C PRIOR ART

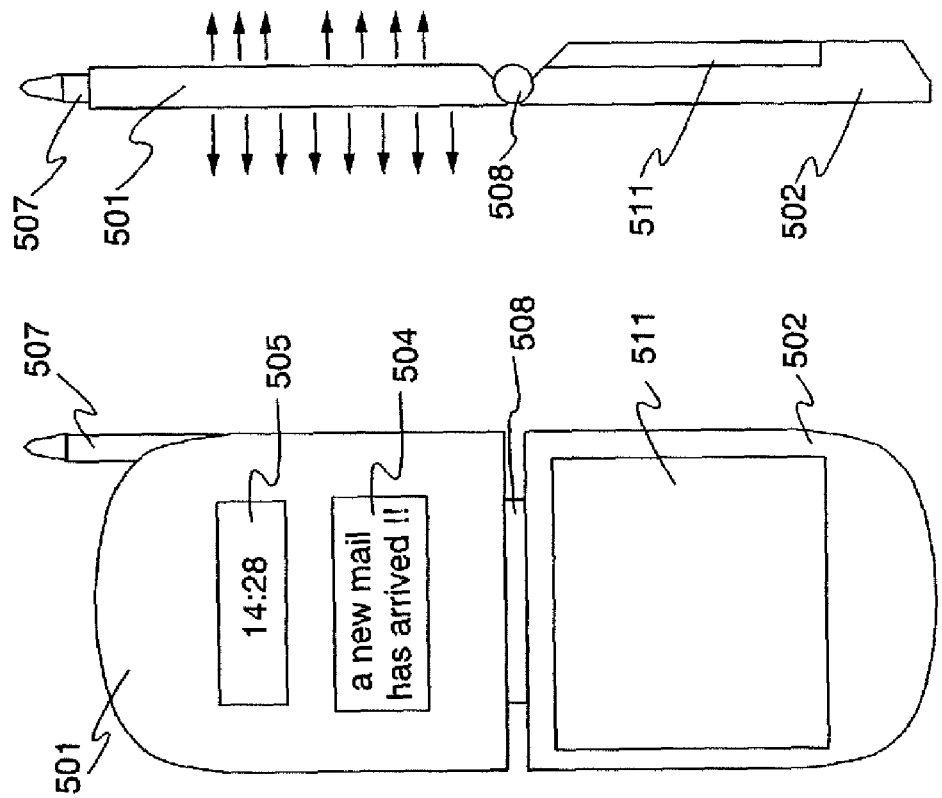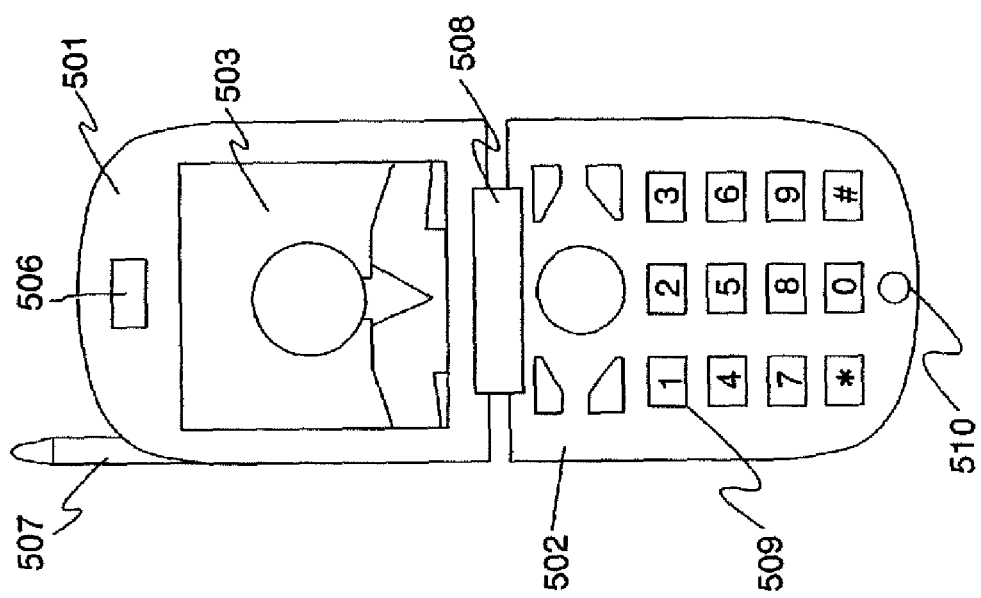
Fig. 5A  Fig. 5B  Fig. 5C

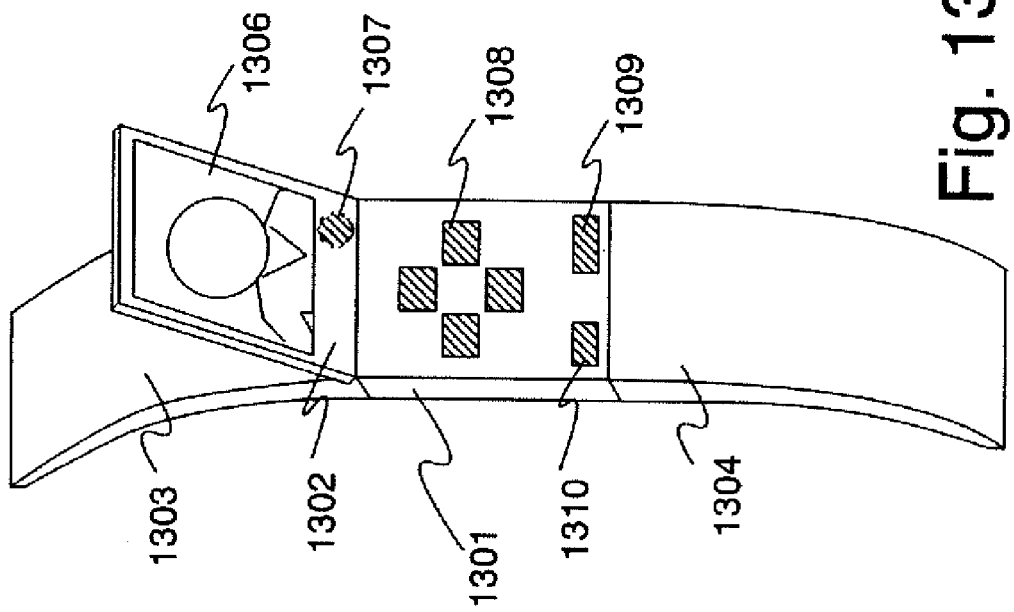
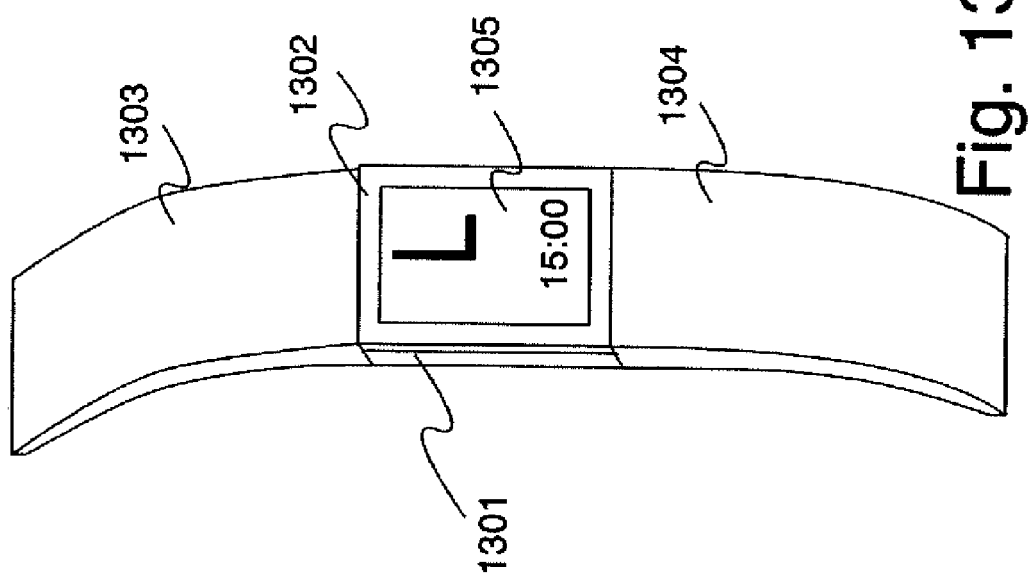

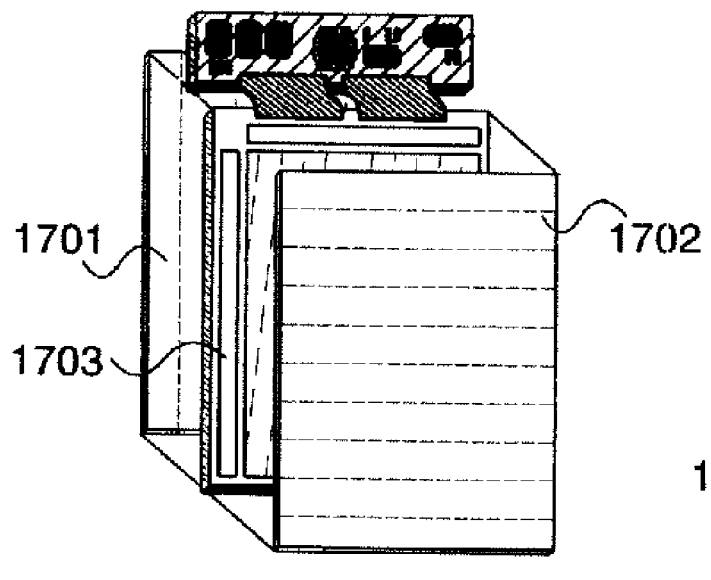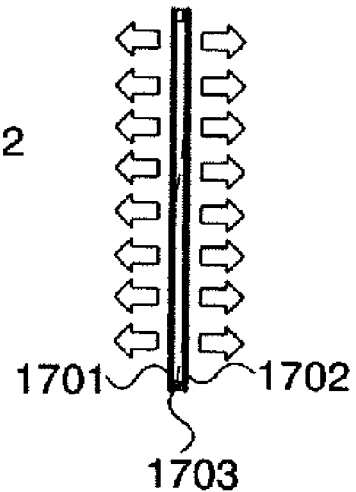
Fig. 17A  Fig. 17B
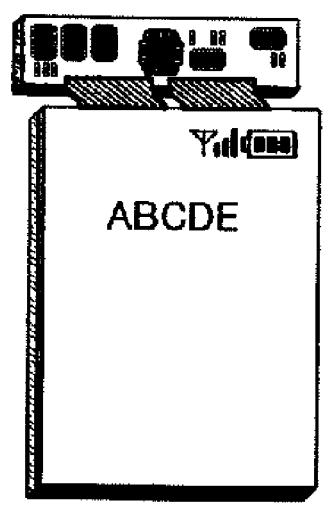
Fig. 17C

DISPLAY DEVICE AND AN ELECTRONIC APPARATUS USING THE SAME

BACKGROUND OF THE INVENTION

1. Field of the Invention

The present invention relates to a display device having a display screen which is formed on a flat plate surface by using a light emitting element typified by an electro luminescence element, and more particularly relates to an electronic apparatus using the display device.

2. Description of Related Art

In recent years, with the development in communication technologies, portable telephone sets have been widely used. In future, transmission of moving pictures and transmission of a large volume of information are expected. On the other hand, through reduction in weight of personal computers (PCs), those adapted for mobile communication have been produced. Information terminals called PDA originated in electronic notebooks have also been produced in large quantities and widely used. In addition, with the advance of display devices, most of those portable information apparatuses are equipped with a flat panel display.

Among active matrix display devices, manufacturing of a display device by the use of low temperature poly-silicon thin film transistors (referred to as TFTs hereinafter) is promoted. The use of low temperature poly-silicon TFTs has advantages in that in addition to manufacturing of a pixel, a signal line driver circuit can be integrally formed around a pixel portion in a display device. Thus, it is possible to realize miniaturization and high definition of a display device, and such a display device is expected to be more widely used in future.

For portable PCs, tablet PCs have been developed. As shown in FIGS. 2A and 2B, a tablet PC comprises a first housing 201, a second housing 202, a keyboard 203, a touch pad 204, a display portion 205 including a touch sensor, an axis of rotation 206, and a touch pen 207. When using the keyboard 203 in such a tablet PC, as shown in FIG. 2A, data can be input with the keyboard 203 while looking at the display as in other notebook PCs. Meanwhile, when characters and data are input without using the keyboard 203, as shown in FIG. 2B, the display portion 205 including a touch sensor and the touch pen 207 are used by rotating the first housing 201 in a complicated way and covering the keyboard 203 with the first housing 201.

As for portable telephone sets, bar-type phones have been replaced by flip phones, and among flip phones, those having two displays have been actively developed. FIGS. 3A, 3B and 3C show an internal side, an external side and a lateral side of a flip phone, respectively. The flip phone shown in FIGS. 3A to 3C comprises a first housing 301, a second housing 302, a first display portion 303, a second display portion 304, a speaker 306, an antenna 307, a hinge 308, a keyboard 309, a microphone 310, and a battery 311. As shown in FIGS. 3A to 3C, a sub-display (the second display portion 304) is provided as well as a main display (the first display portion 303), and thus the time, a battery charge status, a message reception status and the like can be displayed on the sub-display instead of on the main display (see Japanese Laid-Open Patent Application No. 2001-285445, for example).

SUMMARY OF THE INVENTION

In the above-described conventional tablet PC, the first housing is required to be rotated around the axis of rotation in a complicated way in order to use one display portion in different positions. Therefore, mechanical reliability of the tablet PC is lowered as compared with a PC using a simple hinge, thus machine life is shortened.

In the above-described portable telephone set comprising both a main display and a sub-display, control circuits for controlling each of the displays are necessarily provided, leading to the increase in the number of components, and the increase in volume and cost of the portable telephone set. Further, the two displays make the first housing thicker and also increase the volume of the portable telephone set.

In view of the foregoing, it is a general object of the invention to provide a display device having two displays while reducing the number of components and volume and improving mechanical reliability. It is another object of the invention to provide an electronic apparatus using such a display device.

To solve the above-described problems, according to the invention, a dual emission display is used, which serves as both a main display and a sub-display. The dual emission display allows an electronic apparatus to have a high reliability without using a complicated axis of rotation.

A display device according to the invention comprises a light emitting element formed over a light transmissive substrate, wherein light from the light emitting element is emitted to the light transmissive substrate side and to the opposite side thereof so as to form a first display surface and a second display surface, and a first display screen formed on the first display surface is as large as a second display screen formed on the second display surface.

A display device according to the invention comprises a light emitting element formed over a light transmissive substrate, wherein light from the light emitting element is emitted to the light transmissive substrate side and to the opposite side thereof so as to form a first display surface and a second display surface, and a first display screen formed on the first display surface is larger than a second display screen formed on the second display surface.

A display device according to the invention comprises a light emitting element formed over a light transmissive substrate, wherein light from the light emitting element is emitted to the light transmissive substrate side and to the opposite side thereof so as to form a first display surface and a second display surface, and a plurality of display screens are formed on either the first display surface or the second display surface.

In the above-described display device according to the invention, the light emitting element may emit white light and a color filter may be provided on the side of the first display surface.

In the above-described display device according to the invention, the first display surface and the second display surface may be formed of a plurality of light emitting elements having different emission colors.

In the above-described display device according to the invention, the scan direction of the first display screen may be different from that of the second display screen.

In the above-described display device according to the invention, the first display screen and the second display screen may comprise a signal line driver circuit in common and the signal line driver circuit may have a switching means for changing the scan direction.

The above-described display device according to the invention may comprise a volatile storage means and a switching means for changing the reading order of data stored in the volatile storage means.

In the above-described display device according to the invention, the first display surface and the second display surface may be sandwiched between at least two polarizers having different polarization directions.

The above-described display device according to the invention may comprise a signal line driver circuit capable of arbitrarily selecting a signal line from a plurality of signal lines extending on the first display screen and the second display screen, and capable of outputting an image signal to the signal line.

In the above-described display device according to the invention, a photoelectric converter is provided on either or both of the first display screen and the second display screen.

An electronic apparatus according to the invention comprises a light emitting element formed on a light transmissive substrate, a first housing and a second housing which are connected to each other so as to be used both in open position and closed position, a display means mounted in the first housing, which emits light from the light emitting element to the light transmissive substrate side and the opposite side thereof so as to form a first display surface and a second display surface, a detecting means for detecting a signal corresponding to the angle between the first housing and the second housing, and a switching means for changing the scan direction of the display means in accordance with a signal output from the detecting means.

An electronic apparatus according to the invention comprises a light emitting element formed on a light transmissive substrate, and a display means for emitting light from the light emitting element to the light transmissive substrate side and the opposite side thereof so as to form a first display surface and a second display surface, wherein a first display screen formed on the first display surface is as large as a second display screen formed on the second display surface.

An electronic apparatus according to the invention comprises a light emitting element formed on a light transmissive substrate, and a display means for emitting light from the light emitting element to the light transmissive substrate side and the opposite side thereof so as to form a first display surface and a second display surface, wherein a plurality of display screens are formed on either the first display surface or the second display surface.

An electronic apparatus according to the invention includes a personal computer, a video camera, a digital camera, a portable communication tool and the like each of which comprises a display screen.

An electronic apparatus according to the invention may comprise an electrical storage means and a light emission control means for lighting a display screen when the electrical storage means is charged.

The above-described light emission control means may be added with a function for lighting or flashing a display screen or an inverted display screen whose contrast is inverted from that of a normal display screen, or a function for lighting a pixel which is less in deterioration. That is, this light emission control means may be added with a recording medium on which is recorded a control program for lighting or flashing a display screen, a recording medium on which is recorded a control program for lighting or flashing an inverted display screen whose contrast is inverted from that of a normal display screen, or a recording medium on which is recorded a control program for lighting a pixel which is less in deterioration.

In a conventional portable telephone set having a sub-display, the two displays inhibit reduction in volume and cost of the portable telephone set. Meanwhile, in a conventional tablet PC, the use of one display rotated in a complicated way causes a low mechanical reliability.

According to the invention, a dual emission display functions as a plurality of displays and thus an electronic apparatus which is reduced in volume and cost and exhibits an improved mechanical reliability can be achieved.

BRIEF DESCRIPTION OF THE DRAWINGS

FIG. 1A is a front elevational view of an embodiment mode of the invention.
FIG. 1B is a rear elevational view of the embodiment mode of the invention.
FIG. 1C is a side elevational view of the embodiment mode of the invention.
FIG. 3A shows an internal side of a conventional portable telephone set.
FIG. 3B shows an external side of the conventional portable telephone set.
FIG. 3C shows a lateral side of the conventional portable telephone set.
FIG. 5A shows an internal side of a portable telephone set of the invention.
FIG. 5B shows an external side of the portable telephone set of the invention.
FIG. 5C shows a lateral side of the portable telephone set of the invention.
FIGS. 13A and 13B show a wristwatch communication tool using the invention.
FIGS. 17A to 17C show an embodiment mode of the invention in the case of using polarizers.

DETAILED DESCRIPTION OF THE INVENTION

Embodiment Mode

Figure 2A:
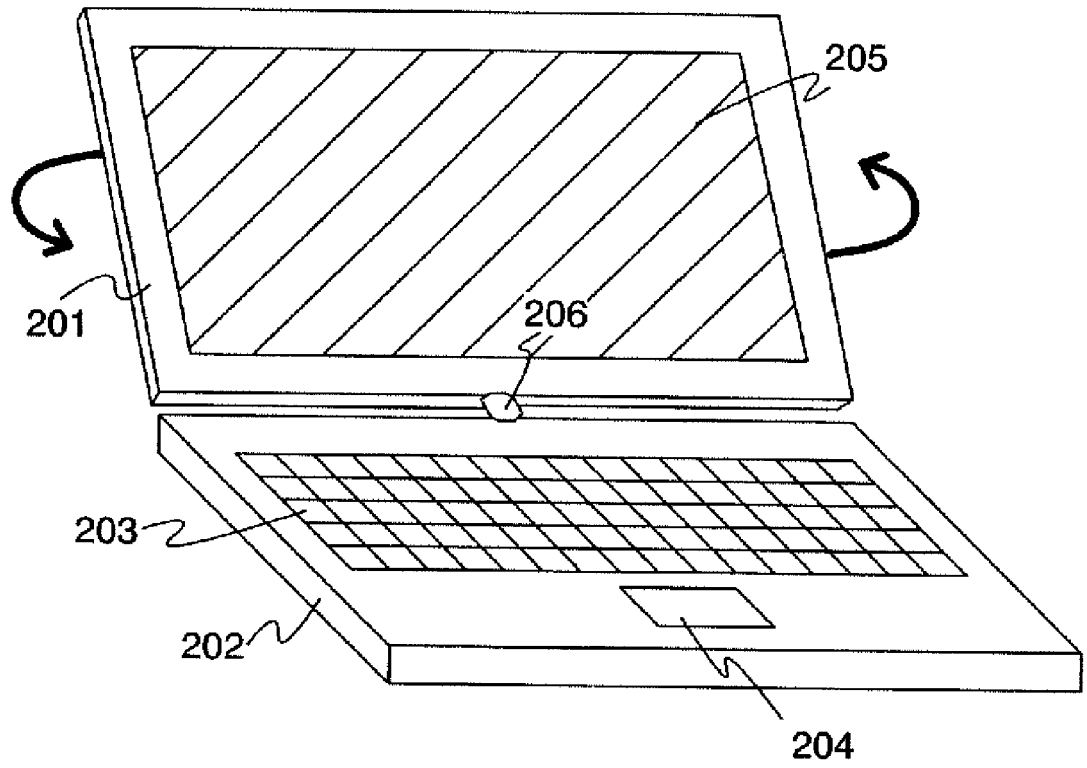
FIG. 2A shows a conventional tablet PC in open position.
Figure 2B:
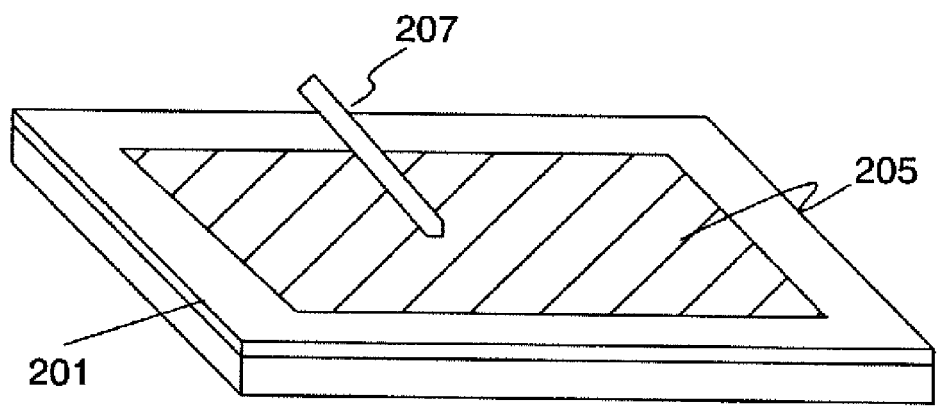
FIG. 2B shows the conventional tablet PC in closed position.

Although the present invention will be fully described by way of example with reference to the accompanying drawings, it is to be understood that various changes and modifications will be apparent to those skilled in the art. Therefore, unless otherwise such changes and modifications depart from the scope of the invention hereinafter defined, they should be constructed as being included therein.

With reference to FIGS. 1A to 1C, Embodiment Mode of the invention will be described hereinafter. FIG. 1A is a view of a display device according to the invention, seen from a first display surface, FIG. 1B is a view of the same seen from a second display surface, and FIG. 1C is a side elevational view of the display device according to the invention. In FIGS. 1A to 1C, the display device of the invention comprises light transmissive substrates 101 and 102, and display screens 105 to 108. A display screen 105 is provided on the first display surface, and display screens 106 to 108 are provided on the second display surface. Driver circuits 103 and 104 for driving the display screens 105 to 108 are made up of TFTs and provided on the light transmissive substrate 101. An image signal and a control signal are input to the driver circuits 103 and 104 through FPCs (Flexible Printed Circuits) 109 and 110 each connected to the light transmissive substrate 101, and thereby drive the display screens 105 to 108.

The display screen 105 on the first display surface displays an image by using substantially the whole of the first display surface. Meanwhile, the display screens 106 to 108 on the second display surface occupy a part of the second display surface to display an image. Accordingly, the display screen 105 can be used as a main display and the display screens 106 to 108 can be used as sub-displays. In FIG. 1B, a received e-mail, the reception status of the radio wave, and the time are displayed on the display screens 106, 107, and 108 respectively. However, displayed content is not limited to these and other content can be displayed. Further, the number of sub-display screens is not limited to three as shown in FIG. 1B, and one or more display screens can be provided arbitrarily.

As for a part of the second display surface, on which no image is displayed, a black display may be kept on or a black matrix may be provided on this part, or the part may be covered with a material of the housing when the display device is put in the housing.

It is to be noted that the number, the form and the size of sub-display screens are not limited to examples shown in FIG. 1B, and can be determined arbitrarily. The emission color of the main display screen can also be selected arbitrarily. For example, when a white light emitting element is used for a light emitting element of the display device, a full color display may be performed on the main display screen by using color filters, and a white display may be performed on the sub-display screens without using color filters. Alternatively, a light emitting element including a plurality of emission colors may be used.

The display device according to the invention described above has a built-in driver circuit though the driver circuit is not necessarily implemented in the display device. An LSI may be bonded with TAB or a chip may be attached directly on a light transmissive substrate. Also, the display portion is not limited to an active matrix type using poly-silicon TFTs, and an active matrix type using amorphous TFTs or a passive matrix type may also be used.

Figure 18:
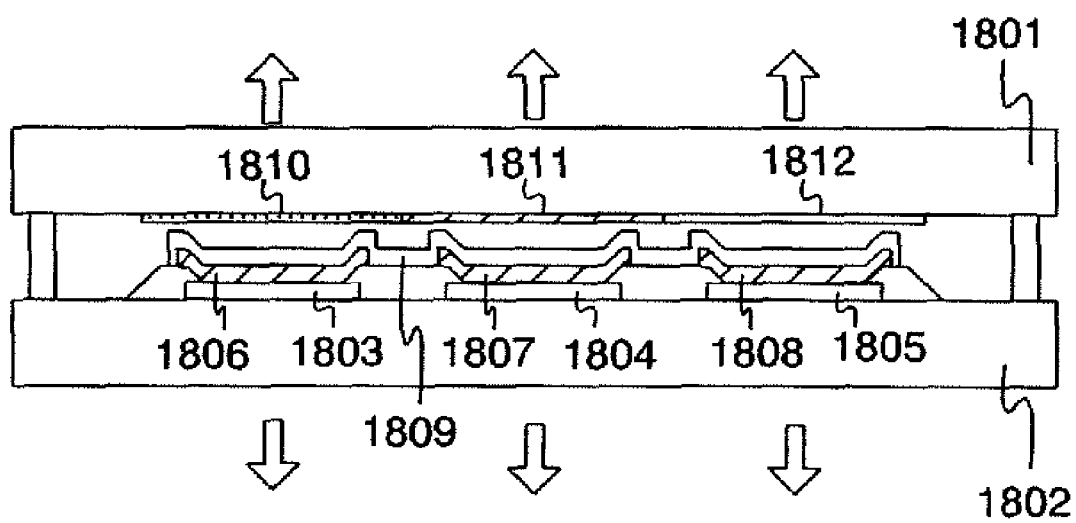
FIG. 18 is a schematic diagram of a dual emission display device.

FIG. 18 is a schematic diagram of a dual emission display device according to the invention. In FIG. 18, the display device comprises light transmissive substrates 1801 and 1802, and transparent or quasi-transparent electrodes 1803 to 1805 and 1809 interposed between the two substrates. Light emitting elements 1806 to 1808 are sandwiched between the electrodes 1803 to 1805 and 1809. On a surface of the light transmissive substrate 1801, color filters 1810 to 1812 are disposed. When the light emitting elements 1806 to 1808 emit a white light, a full color display can be performed on the first light emitting surface and a white display can be performed on the second light emitting surface. The color filters are not necessarily provided and the light emitting elements 1806 to 1808 may include a plurality of emission colors. In the latter case, the same color is displayed on each of the first light emitting surface and the second light emitting surface. For the light emitting elements 1806 to 1808, light emitting elements typified by electro luminescence (EL) elements are used. According to such a structure, the dual emission display device can be achieved.

Figure 4A:
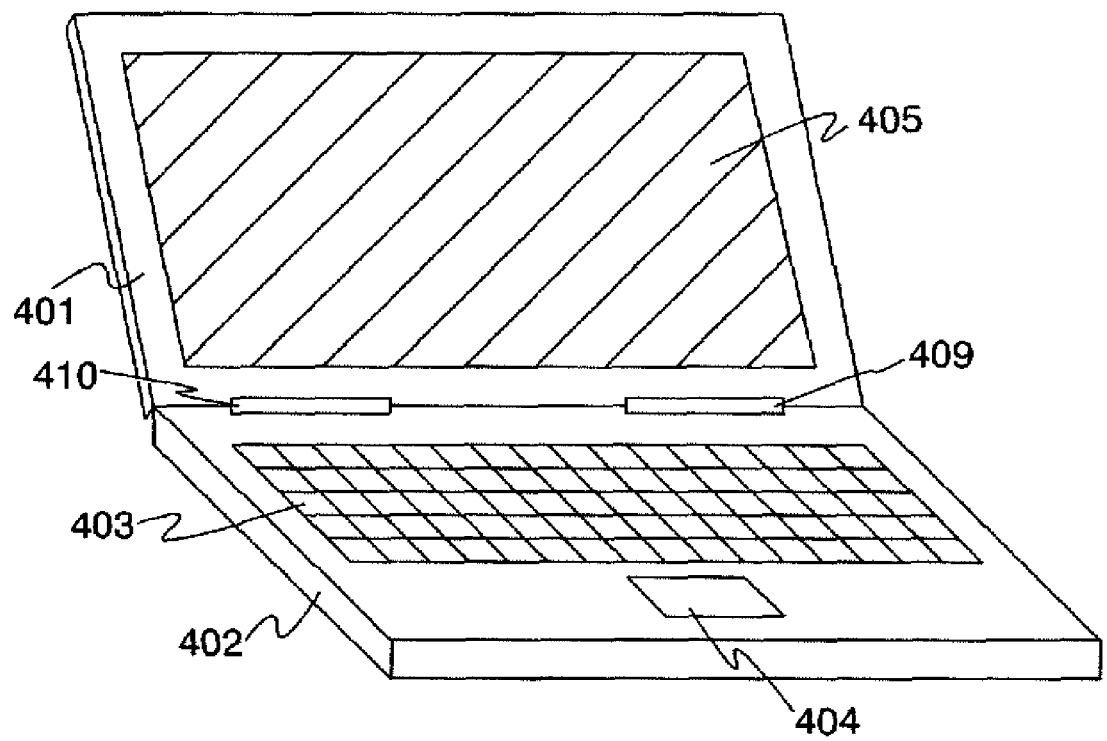
FIG. 4A shows a tablet PC of the invention in open position.
Figure 4B:
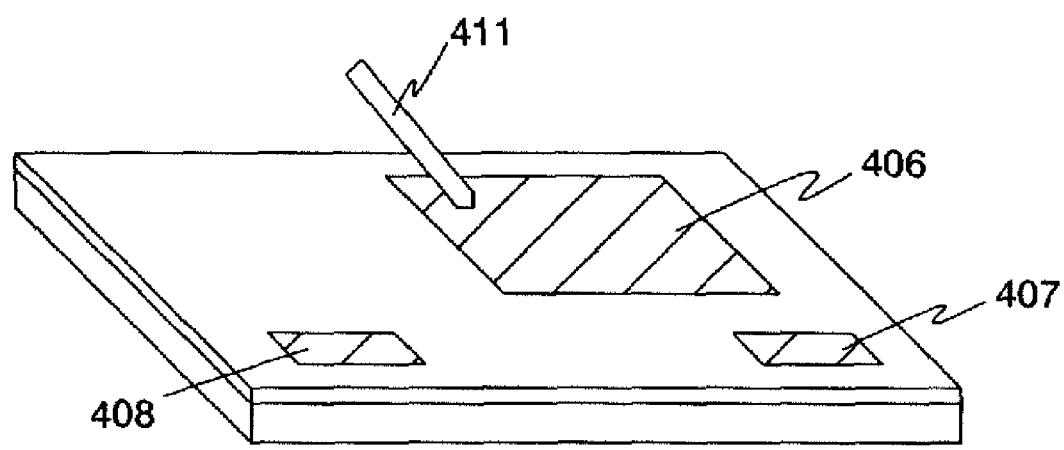
FIG. 4B shows the tablet PC of the invention in closed position.

With reference to FIGS. 4A and 4B, an embodiment mode of the invention, which is applied to a tablet PC, will be described. The tablet PC shown in FIGS. 4A and 4B comprises a first housing 401, a second housing 402, hinges 409 and 410 for connecting the first housing 401 with the second housing 402, a keyboard 403, a touch pad 404, a main display screen 405, sub-display screens 406 to 408, and a touch pen 411. Since the sub-display screen 406 includes a touch sensor as described in the related art, users can enjoy the advantage of the tablet PC by using the touch pen 411.

In the conventional tablet PC described in the related art, the display device comprises only one display portion and the housing is rotated around the axis of rotation in order to use the display portion for both a main display and a tablet display. In the embodiment mode shown in FIGS. 4A and 4B, however, the complicated axis of rotation described in the related art is dispensed with by using the display device of the invention shown in FIGS. 1A to 1C, and only the hinges 409 and 410 are required. According to such a structure, the mechanical reliability which is acknowledged as a problem in the conventional tablet PC can be enhanced.

FIGS. 5A to 5C shows an embodiment mode of a portable telephone set using the display device of the invention. The portable telephone set shown in FIGS. 5A to 5C comprises a first housing 501, a second housing 502, a first display screen 503, a second display screen 504, a third display screen 505, a speaker 506, an antenna 507, a hinge 508, a keyboard 509, a microphone 510, and a battery 511. FIGS. 5A, 5B, and 5C show an internal side, an external side, and a lateral side of the portable telephone set, respectively. The display device of the invention is mounted in the first housing 501. Accordingly, the first housing 501 of the display device according to the invention can be reduced in thickness as compared with that of the conventional portable telephone set shown in the related art, in which the two display devices are mounted.

The number of sub-display screens is not limited to two as shown in FIG. 5B, and one or three or more sub-display screens may be used.

Although the tablet PC and the portable telephone set are described in this embodiment mode, the invention is not exclusively applied to these, and can be applied to electronic apparatuses using various display devices, such as a PDA, a video camera, a digital camera, a portable DVD (Digital Versatile Disc), a portable TV, and a game machine.

Embodiment 1

Figure 6:
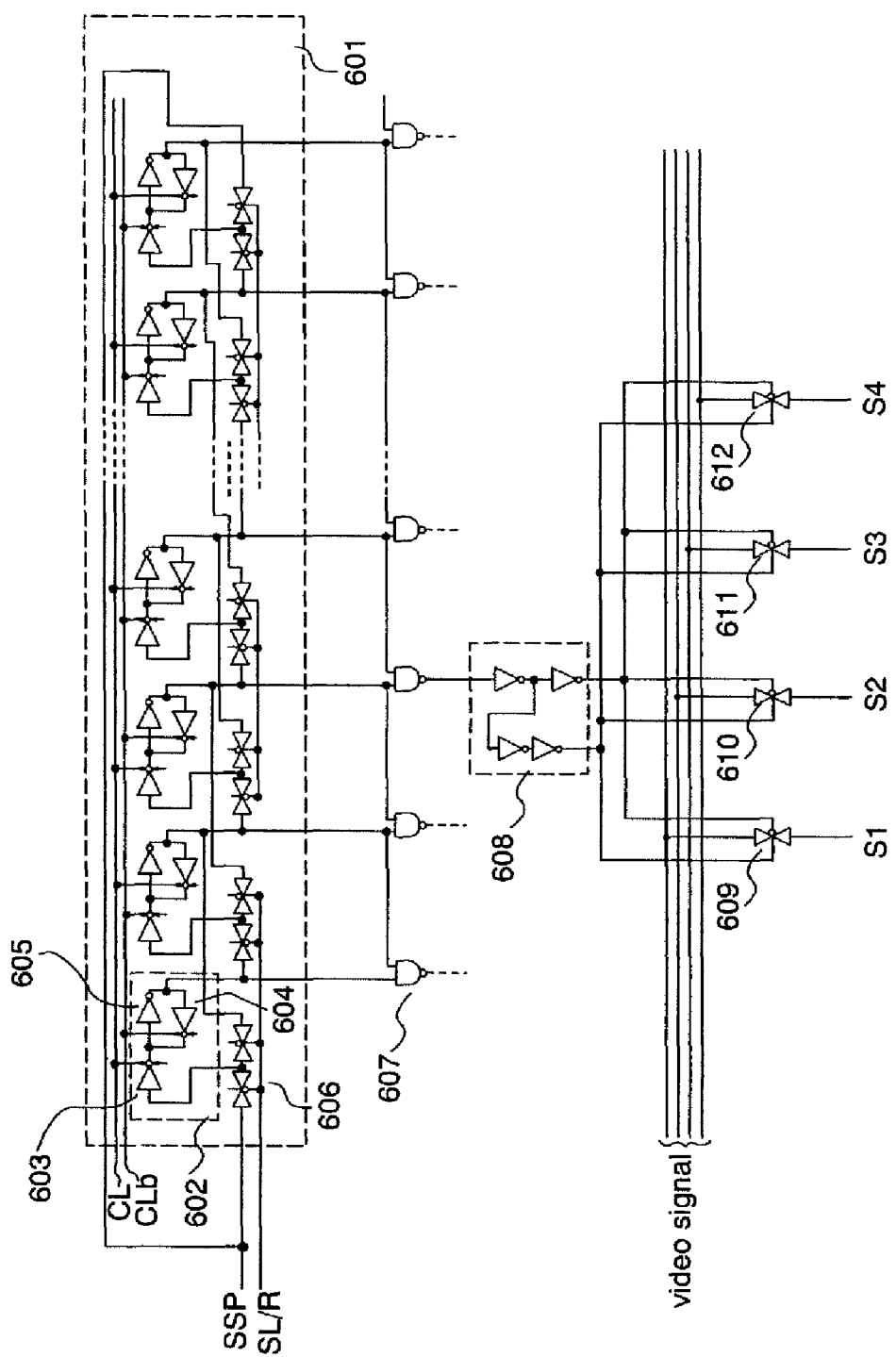
FIG. 6 is a circuit diagram of a source signal line driver circuit.

With reference to FIG. 6, explanation will be made on a source signal line driver circuit used for the display devices of the invention. Since images are displayed on both sides of the display device in the invention, the images are displayed in opposite directions viewing from the opposite side. Therefore, the driving direction of the screen has to be changed depending on the direction from which the screen is viewed. Thus, in the display device of the invention, a source signal line driver circuit is formed as shown in FIG. 6.

A source signal line driver circuit shown in FIG. 6 comprises a shift register 601, a NAND circuit 607, a buffer circuit 608, and analog switches 609 to 612. The operation is explained hereinafter. The shift register 601 is formed with a series of DFFs 602, each of which comprises clocked inverters 603 and 604 and an inverter 605. A signal is input to the DFF 602 from a terminal SSP and transferred to the subsequent DFF 602 by clock signals (CL and CLK). A switch 606 is controlled by a SL/R to select whether to transfer a pulse to the precedent stage or to the subsequent stage. When the precedent stage is selected by the switch 606, a pulse is transferred from left to right, and when the subsequent stage is selected, a pulse is transferred from right to left.

These pulses are transferred to the NAND circuit 607 and then to the buffer circuit 608 to drive the analog switches 609 to 612. Image signals are sampled through the analog switches 609 to 612 and transferred to source signal lines S1 to S4.

In this manner, the switch 606 enables the image direction to change to the left or right, and the source signal line driver circuit can be applied to the dual emission display device of the invention. It is to be noted that such driver circuit may be formed on a light transmissive substrate by using TFTs, an LSI may be bonded with TAB, or an LSI may be attached directly on a light transmissive substrate.

Embodiment 2

Figure 15A:
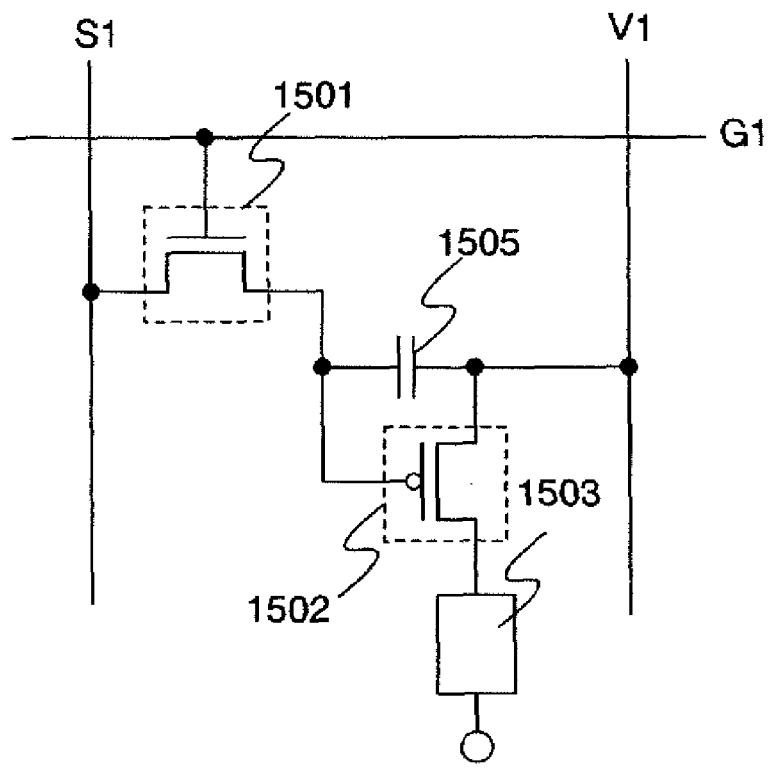
FIG. 15A shows a pixel of an active matrix light emitting device.
Figure 15B:
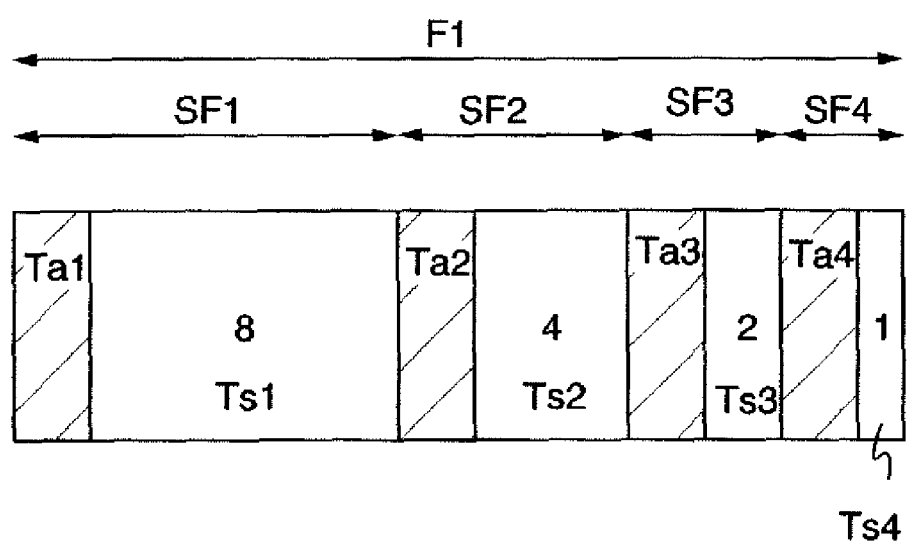
FIG. 15B is a timing chart of the same.

FIGS. 15A and 15B show an example of a light emitting display device using time gray scale. FIG. 15A shows a pixel for driving a light emitting element 1503 by using time gray scale. The pixel comprises a driving TFT 1502, a storage capacitor 1505 and a switching TFT 1501 as well as the light emitting element 1503. A gate of the switching TFT 1501 is connected to a gate signal line G1, when the gate signal line G1 is high, the switching TFT 1501 is turned ON and data on a source signal line S1 is written to the storage capacitor 1505 and a gate of the driving TFT 1502. When the driving TFT 1502 is turned ON, a current is supplied from a power supply line V1 to the light emitting element 1503 through the driving TFT 1502. This state is held until the next writing is done.

FIG. 15B is a timing chart of time gray scale. In this embodiment, 4-bit time gray scale is taken as an example, though the invention is not exclusively limited to 4-bit. One frame is composed of four sub-frames SF1 to SF4. The sub-frames SF1 to SF4 each include address periods (writing periods) Ta1 to Ta4, and sustain periods (lighting periods) Ts1 to Ts4, respectively. When the ratio between the sustain periods Ts1:Ts2:Ts3:Ts4 is set equal to 8:4:2:1, each bit corresponds to each sustain period, thus time gray scale can be achieved. The address periods emit no light at this time, and perform only writing.

Figure 9:
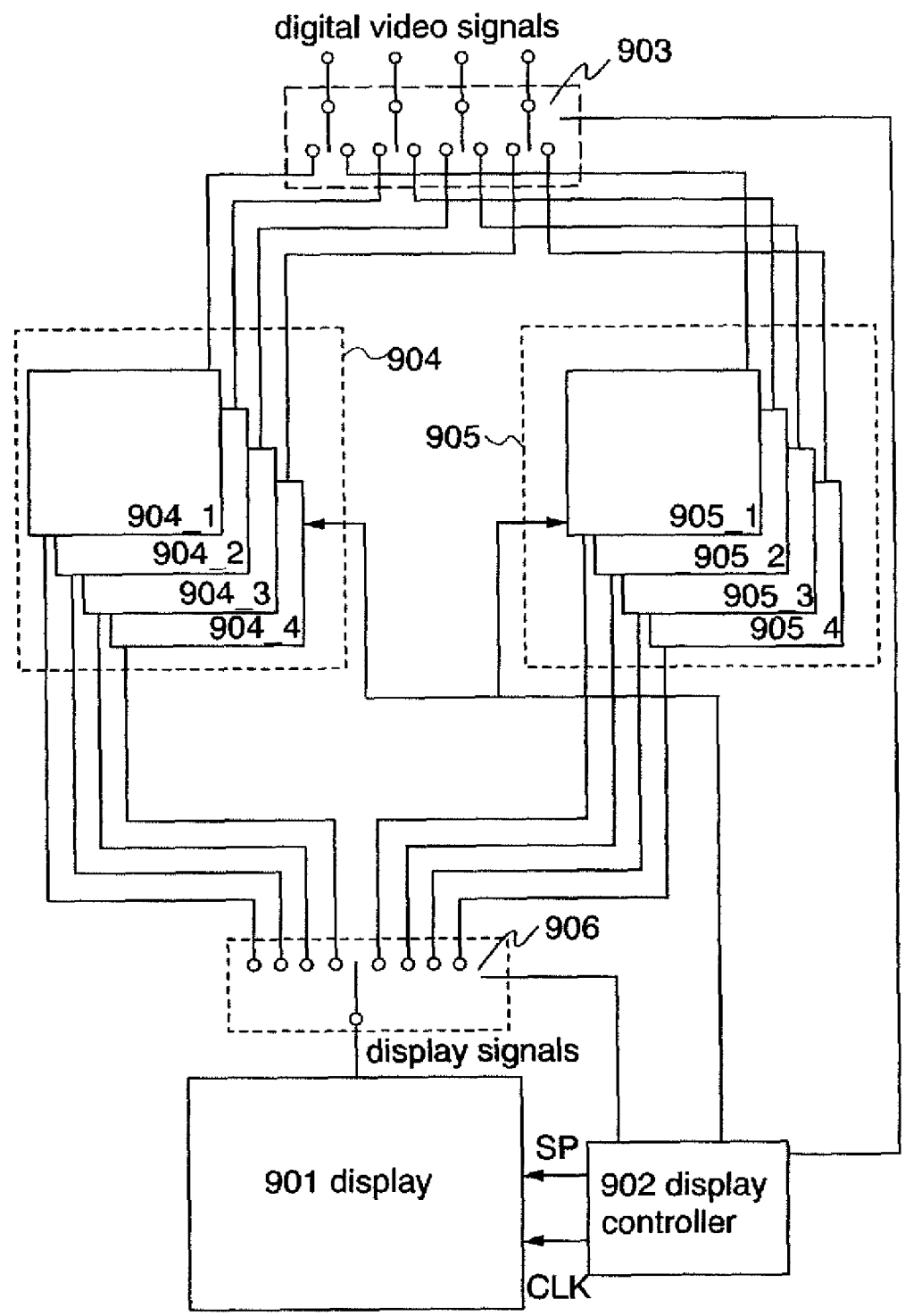
FIG. 9 is a block diagram of a display controller.

In order to drive the display device by using such time gray scale, a display controller and a memory are required for generating sub-frames. The display controller and the memory also enable to change the image direction to the left and right. FIG. 9 shows a display controller and a memory. In this example, a 4-bit digital video signal is divided into sub-frames, though the invention is not exclusively limited to the 4-bit signal. The operation will be described hereinafter. First, a display controller 902 inputs a digital video signal to a memory A 904 through a switch 903. After all the data in the first frame is input to the memory A 904, the switch 903 is switched to a memory B 905 to write a digital video signal in the second frame.

On the other hand, a switch 906 is sequentially connected to memories A 904-1 to 904-4, and the signal stored in the memory A 904 is input to a display 901. After all the data in the second frame is input to the memory B 905, the switch 903 is switched to the memory A 904 to write a digital video signal in the third frame. Meanwhile, the switch 906 is sequentially connected to memories B 905-1 to 905-4, and the signal stored in the memory B 905 is input to the display 901. By repeating such an operation, sub-frames can be generated.

In the case where an image direction is changed to the left and right, signals are reversely called up per column of a display when the memory A 904 or the memory B 905 is called up. In this manner, in the display device in which sub-frames are generated, dual emission can be achieved by changing the order of calling up the memory.

Embodiment 3

Figure 16A:
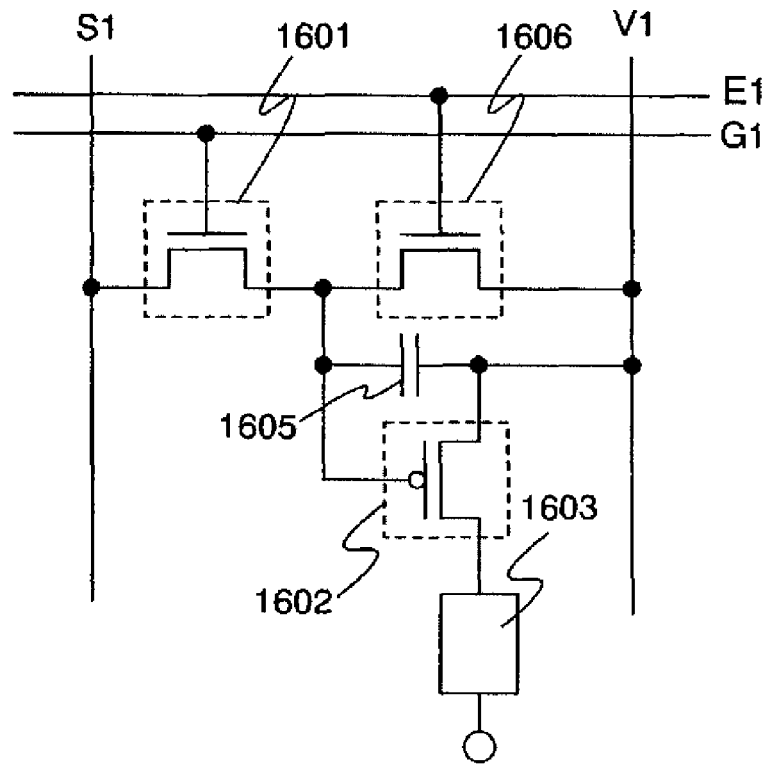
FIG. 16A shows a pixel of an active matrix light emitting device.
Figure 16B:
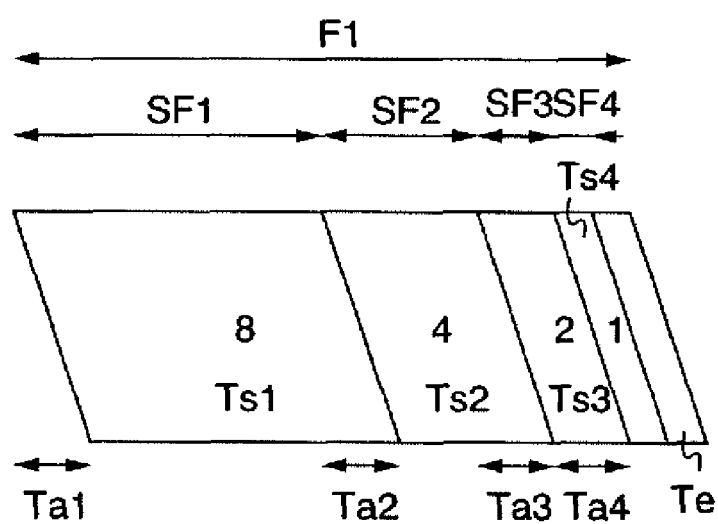
FIG. 16B is a timing chart of the same.

FIGS. 16A and 16B show an example of a light emitting display device using time gray scale. FIG. 16A shows a pixel for driving a light emitting element 1603 by using time gray scale. The pixel comprises a driving TFT 1602, an erasing TFT 1606, a storage capacitor 1605 and a switching TFT 1601 as well as the light emitting element 1603. A gate of the switching TFT 1601 is connected to a gate signal line G1. When the gate signal line G1 is high, the switching TFT 1601 is turned ON, and data on a source signal line S1 is written to the storage capacitor 1605 and a gate of the driving TFT 1602. When the driving TFT 1602 is turned ON, a current is supplied from a power supply line V1 to the light emitting element 1603 through the driving TFT 1602. This state is held until the next writing is done.

FIG. 16B is a timing chart of time gray scale. In this embodiment, 4-bit time gray scale is taken as an example, though the invention is not exclusively limited to 4-bit. One frame is composed of four sub-frames SF1 to SF4. The sub-frames include address periods (writing periods) Ta1 to Ta4, sustain periods (lighting periods) Ts1 to Ts4, and an erase period Te when the ratio between the sustain periods Ts1:Ts2:Ts3:Ts4 is set equal to 8:4:2:1, each bit corresponds to each of the sustain periods, thus time gray scale can be achieved. By providing the erase period Te in this pixel, it is possible to use time effectively. Light can be emitted in the address periods in the example shown in FIGS. 16A and 16B, though it is not possible in the example shown in FIGS. 15A and 15B. The erase period Te is required in the case where the lighting period is shorter than the address period. Thus, an erasing TFT 1606 and an erase line E1 are added for erasing in the pixel in FIG. 16A.

As in Embodiment 2, the image direction can be changed to the left and right by changing the order of calling up the memory circuit.

Figure 19:
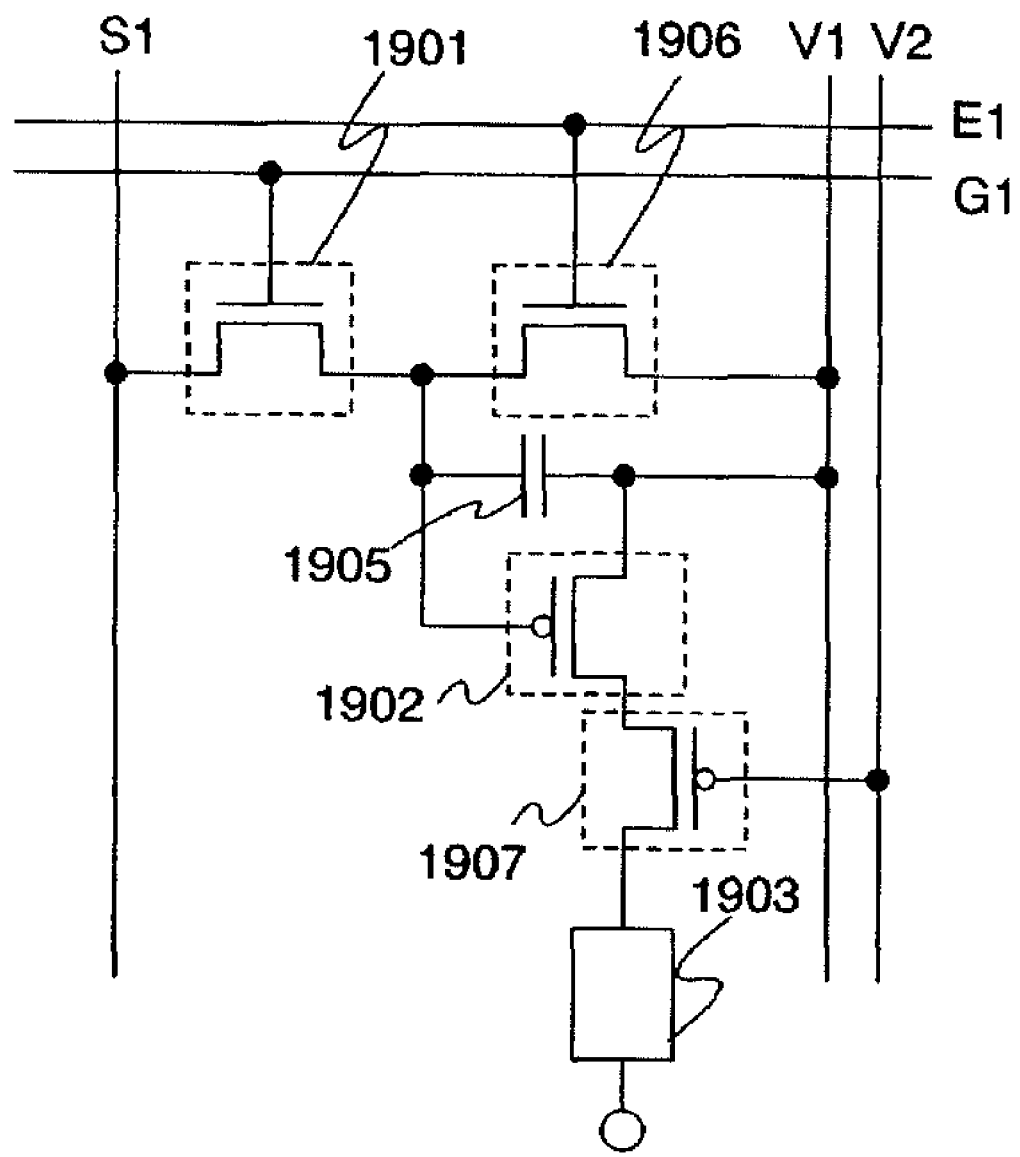
FIG. 19 shows a pixel of a display device of the invention.

FIG. 19 shows an example of a pixel which is different from that in FIG. 16A. FIG. 19 shows a pixel for driving a light emitting element 1903 by using time gray scale. The pixel comprises a driving TFT 1907, an erasing TFT 1906, a storage capacitor 1905 and switching TFTs 1901 and 1902 as well as the light emitting element 1903. A gate of the switching TFT 1901 is connected to a gate signal line G1. When the gate signal line G1 is high, the TFT 1901 is turned ON, and data on a source signal line S1 is written to the storage capacitor 1905 and a gate of the switching TFT 1902. When the switching TFT 1902 is turned ON, a current is supplied from a power supply line V1 to the light emitting element 1903 through the switching TFT 1902 and the driving TFT 1907. This state is held until the next writing is done. A gate of the driving TFT 1907 is connected to a power supply line V2 which has a fixed potential. When the switching TFT 1902 is turned ON, a current corresponding to a potential difference between the V1 and the V2 is supplied to the light emitting element 1903. Such a pixel is suitable for constant current drive in which the driving TFT 1907 is used in a saturation region.

Embodiment 4

Figure 7:
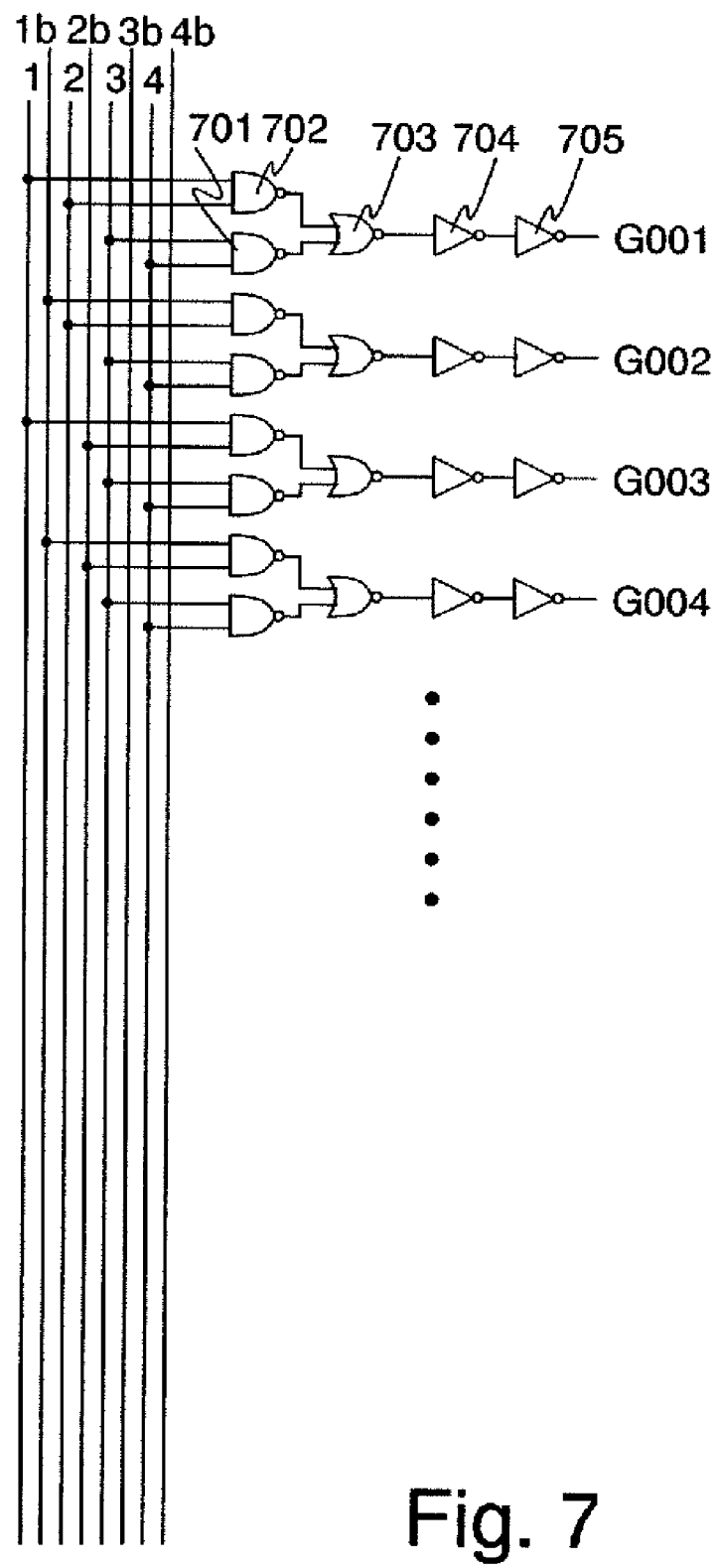
FIG. 7 is a circuit diagram of a gate signal line driver circuit with a decoder.

FIG. 7 shows an example of a gate signal line driver circuit using a decoder. The decoder inputs address signals from address lines 1, 1*b*, 2, 2*b*, 3, 3*b*, 4, and 4*b* to NAND circuits 701 and 702, and outputs the address signals to a gate signal line G001 through a NOR circuit 703 and inverters 704 and 705. In the above-described shift register, a signal line can not be selected arbitrarily because pulses are sequentially shifted, while in the decoder, a signal line can be selected arbitrarily by performing addressing. Accordingly, by using the decoder, the display screen shown in Embodiment Mode can be lighted partially, and the lighted part can be used for a sub-display.

Embodiment 5

FIGS. 13A and 13B show a wristwatch communication tool sing the invention. FIG. 13A is the wristwatch communication tool in closed position and FIG. 13B is the same in open position. Reference numeral 1301 denotes a first housing and 1302 denotes a second housing. The display device of the invention is mounted in the second housing 1302. Reference numerals 1303 and 1304 denote belts, 1305 denotes a first display surface, 1306 denotes a second display surface, 1307 denotes a camera, 1308 denotes a keyboard, 1309 denotes a microphone, and 1310 denotes a speaker.

In the case of using the communication tool in closed position, the time is displayed on the first display surface 1305, and the communication tool can be used as a common wristwatch. When using it in open position, various images can be displayed on the second display surface 1306. When the communication tool has the video phone function, for example, it is possible to display the face of the person at the other end of the line. Alternatively, the second display surface 1306 can be used as a Web terminal by accessing to the Internet. Also, other software applications or TV programs can be displayed on it. The first display surface 1305 may display a message reception status or a battery charge status as well as the time.

Embodiment 6

Figure 11A:
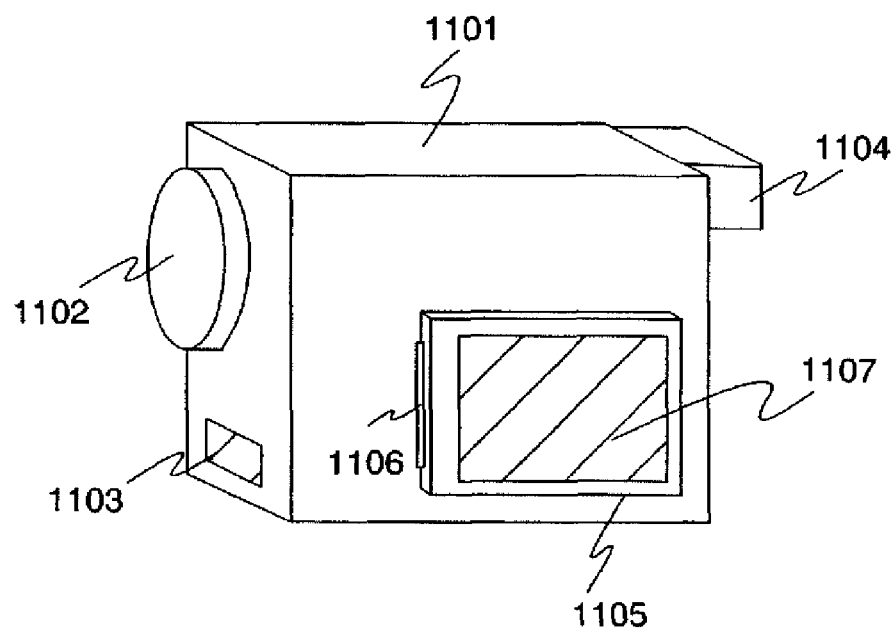
FIGS. 11A and 11B show a video camera using the invention.
Figure 11B:
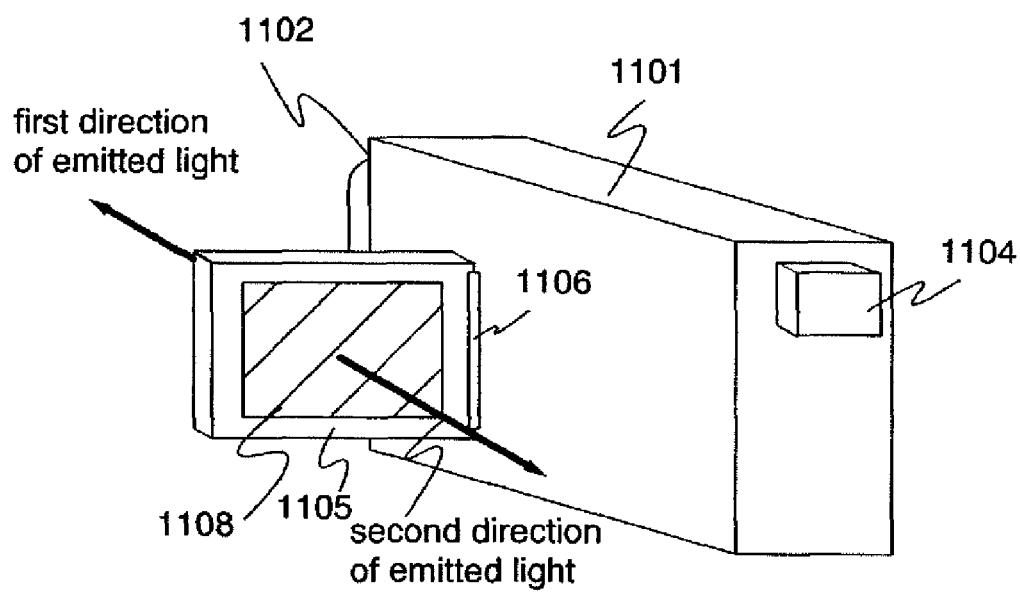

FIGS. 11A and 11B show a video camera using the invention. Generally in a video camera, a liquid crystal display is used for a monitor. When a videographer records a video image of others or objects, a monitor has to be turned to the opposite direction of a camera lens. On the other hand, when a videographer records a video image of himself, the monitor has, to be turned to the same direction of the camera lens. Therefore, it is necessary to rotate the monitor with respect to a main body of the camera. Thus, a complicated axis of rotation as provided in the conventional tablet PC is required, which causes the decrease of reliability. In the video camera using the invention, images can be displayed on both the first display surface and the second display surface. Accordingly, a simple hinge can be used as a substitute for a complicated axis of rotation, thus reliability can be improved.

The video camera shown in FIGS. 11A and 11B comprises a main body 1101, a lens 1102, a microphone 1103, a finder 1104, a dual emission display 1105, and a hinge 1106. The dual emission display 1105 includes a first display surface 1107 and a second display surface 1108. FIG. 11A shows the case in which the dual emission display 1105 is used in closed position and an image is displayed on the first display surface 1107. FIG. 11B shows the case in which the dual emission display 1105 is used in open position and an image can be displayed on both the first display surface 1107 and the second display surface 1108. In this manner, a monitor can be used in either direction without a complicated axis of rotation, leading to the improvement in the mechanical reliability.

Embodiment 7

Figure 12B:
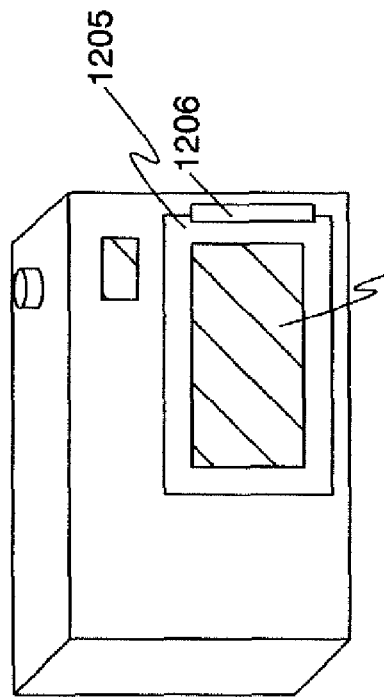
FIGS. 12A to 12D show a digital camera using the invention.
Figure 12D:
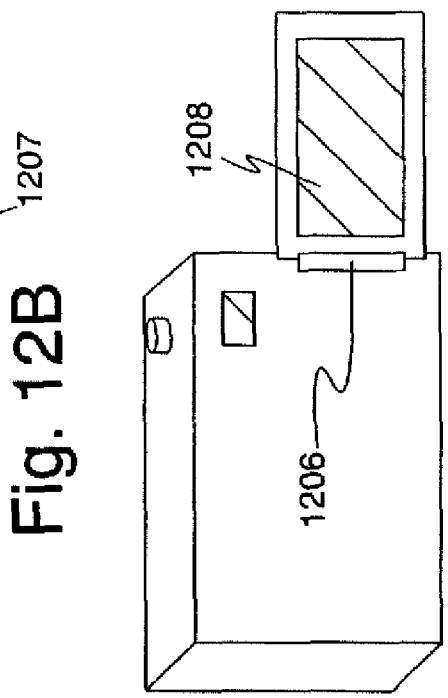
Figure 12A:
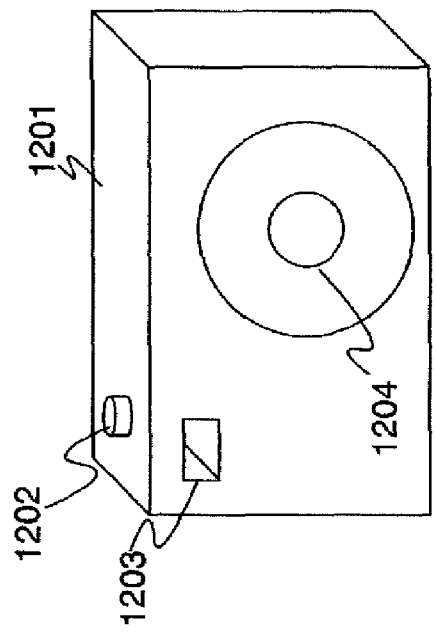
Figure 12C:
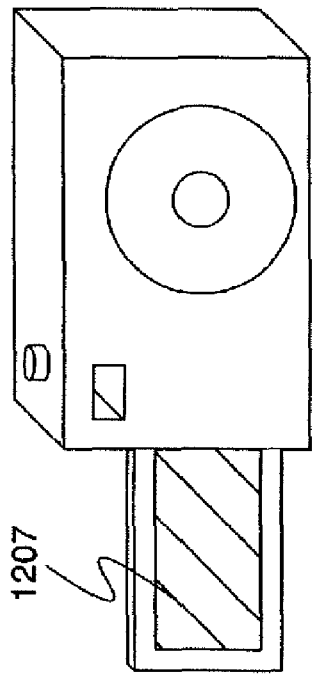

FIGS. 12A to 12D show a digital camera using the invention. A digital camera in this embodiment comprises a main body 1201, a shutter 1202, a finder 1203, a lens 1204, a monitor display portion 1205, and a hinge 1206. The monitor display portion 1205 includes a first display surface 1207 and a second display surface 1208. A conventional digital camera has a built-in monitor display portion which is fixed in it. In the invention, the monitor display portion can be used in either open position or closed position by using the dual emission display device and the hinge 1206. FIG. 12A is a front elevational view of the digital camera, FIG. 12B is a rear elevational view of the same, FIG. 12C is a front elevational view of the monitor in open position, and FIG. 12D is a rear elevational view of the monitor in open position. In this manner, an image can be monitored from either side with the monitor in open position.

Embodiment 8

Figure 10A:
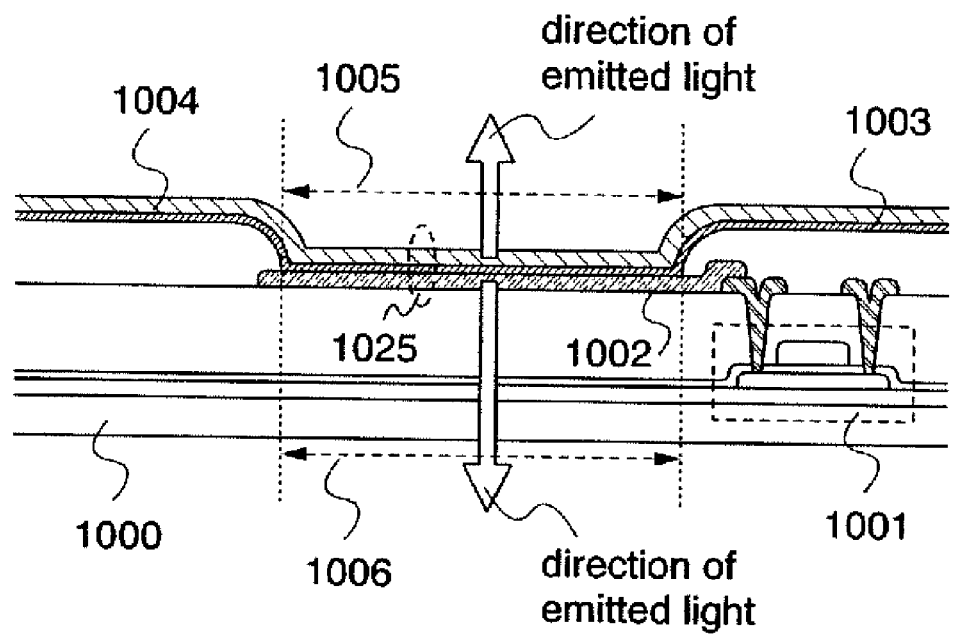
FIGS. 10A and 10B show an embodiment of a dual emission display device.
Figure 10B:
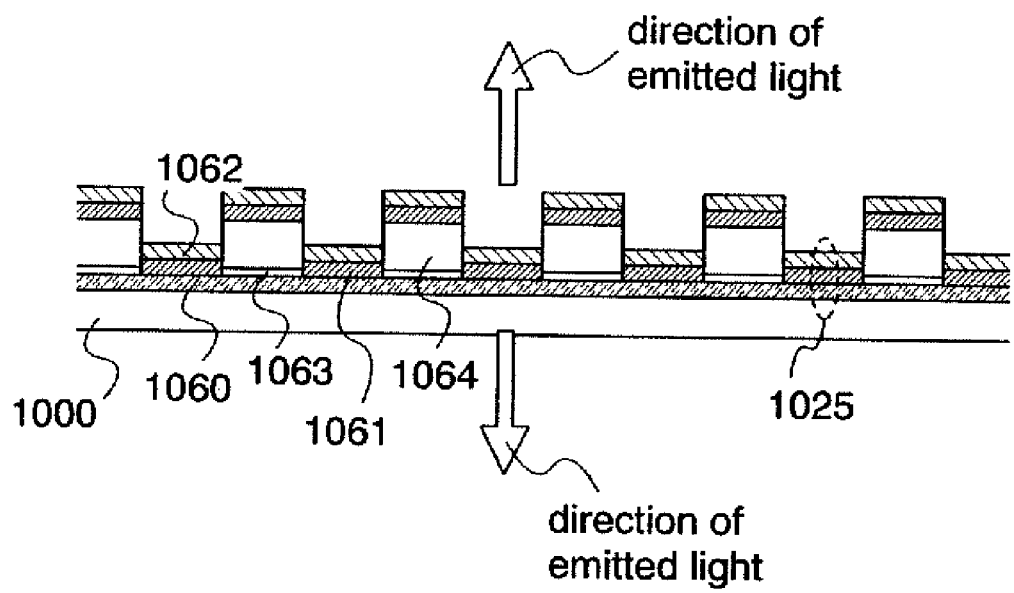

With reference to FIGS. 10A and 10B, an embodiment of the invention will be explained. In this embodiment, a structure of a dual emission display panel including first and second display screens is described in detail. FIG. 10A shows an active element using transistors, and FIG. 10B shows a passive matrix element.

In FIG. 10A, a driving transistor 1001, a first electrode (pixel electrode) 1002, a light emitting layer 1003, and a second electrode (counter electrode) 1004 are provided over a light transmissive substrate 1000. An overlapping area of the first electrode 1002, the light emitting layer 1003 and the second electrode 1004 corresponds to a light emitting element 1025. In the invention, the first electrode 1002 and the second electrode 1004 are formed of a light transmissive material. Therefore, the light emitting element 1025 emits light in the direction of the substrate 1000 (first direction) and in the opposite direction thereof (second direction), and has a first display region 1005 and a second display region 1006. It is to be noted that for a light transmissive material of the first electrode 1002 and the second electrode 1004, used is a light transmissive conductive film such as ITO or aluminum having a thickness enough to transmit light.

In FIG. 10B, a first electrode (pixel electrode) 1060, a light emitting layer 1061 and a second electrode (counter electrode) 1062 are formed over the light transmissive substrate 1000. An overlapping area of the first electrode 1060, the light emitting layer 1061 and the second electrode 1062 corresponds to the light emitting element 1025. An insulating layer 1063 and a resin layer 1064 are also provided to serve as banks.

As described above, the passive element has a structure in which the light emitting layer 1061 is sandwiched between the electrodes. For the light emitting layer 1061, a material composed mainly of inorganic substances may be used. In this case, an insulating layer may be provided between the first electrode 1060 and the light emitting layer 1061 or between the second electrode 1062 and the light emitting layer 1061. For this insulating layer, aluminum oxide ($Al_2O_3$) and titanium oxide ($TiO_2$) may be alternately laminated by thermal CVD using absorption reaction on a deposited surface.

This embodiment can be implemented in combination with other embodiments.

Embodiment 9

Figure 8A:
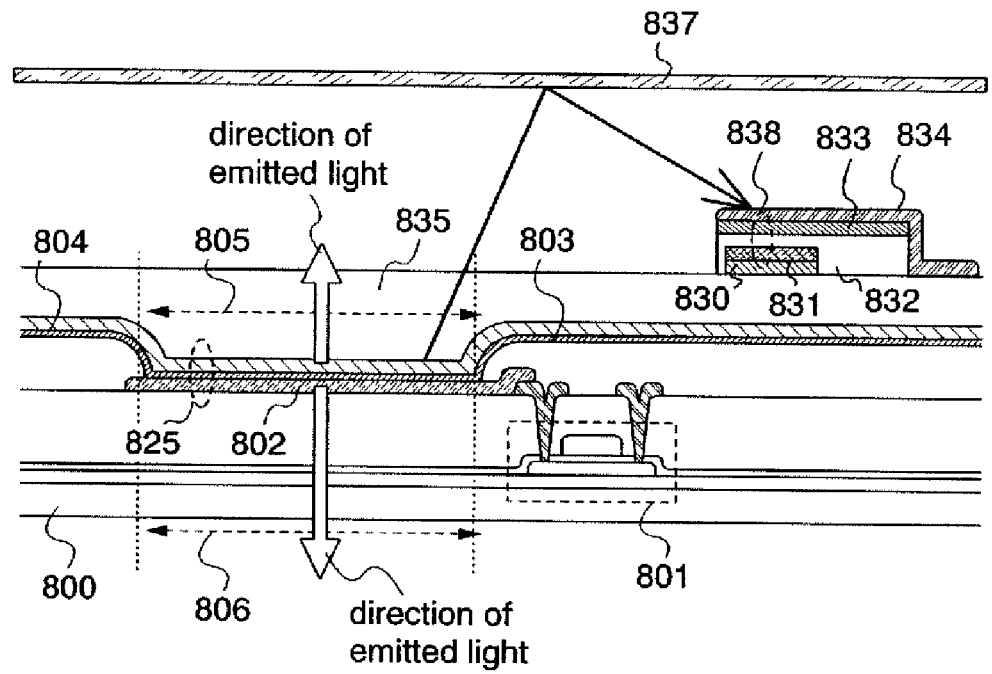
FIGS. 8A and 8B show a display panel with a built-in sensor.
Figure 8B:
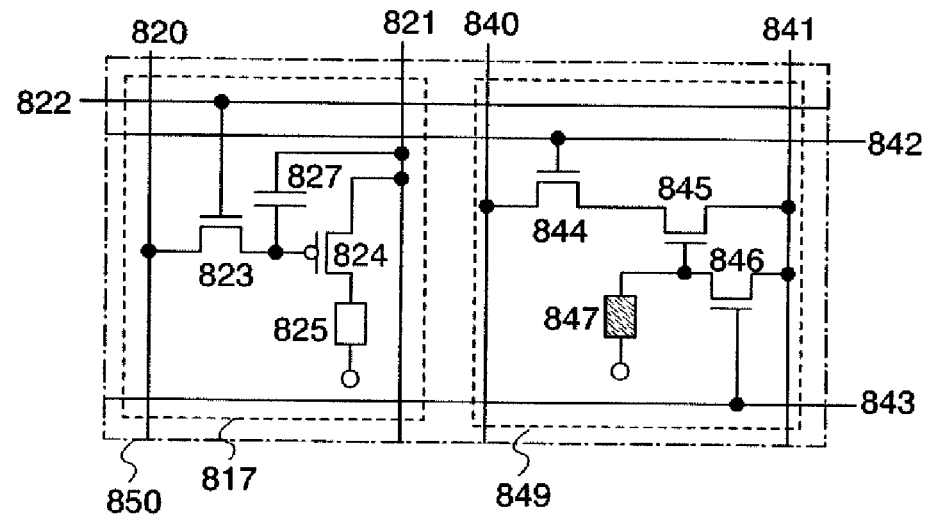

With reference to FIGS. 8A and 8B, an embodiment of the invention will be explained. In this embodiment, a structure of a dual emission display panel which includes first and second display screens and image sensor is described in detail.

In FIG. 8A, a driving transistor 801 and an emitting device 825 having a first electrode (pixel electrode) 802 formed of a light transmissive material, a light emitting layer 803, and a second electrode (counter electrode) 804 formed of a light transmissive material are formed over a light transmissive substrate 800. A light emitting element 825 emits light in the direction of the substrate 800 (first direction) and in the opposite direction thereof (second direction). An insulating layer 835 is formed on the second electrode 804. Over the insulating layer 835 formed over the second electrode 804, provided are a photoelectric converter 838 formed by laminating a P-type layer 831, an I-type (intrinsic) layer 832 and an N-type layer 833, an electrode 830 connected to the P-type layer 831, and an electrode 834 connected to the N-type layer 833.

In the above mentioned dual emission display panel, the light emitting element 825 is used as a light source, and the photoelectric converter 838 is used as an image sensor. The light emitting element 825 and the photoelectric converter 838 are formed over the same substrate 800. A light emitted from the light emitting element 825 is reflected by an object 837 and directed to the photoelectric converter 838. Then, a potential difference between the two electrodes 830 and 834 of the photoelectric converter 838 is changed and a current corresponding to the changed potential difference is supplied between the two electrodes 830 and 834. Thus, data of the object 837 can be obtained by detecting the amount of the supplied current, and the obtained data can be displayed by using the light emitting element 825. It is to be noted that when using an image sensor function, the object 837 is desirably used closely contact with the display surface so that a light emitted from the light emitting element 825 as a light source is reflected by the object 837.

In other words, the light emitting element 825 is used for both displaying an image and for the light source in reading data of the object 837. Further, the dual emission display panel has two functions: an image sensor function for reading data of the object 837 and a display function for displaying an image. In spite of having these two functions, it is not necessary to provide a light source and a light diffusing screen separately in the display panel, which are usually required for using an image sensor function. Therefore, the dual emission display panel of this embodiment allows the display device to be reduced significantly in size, thickness, and weight.

With reference to FIG. 8B, explanation is made on an example of an equivalent circuit used for the above-described dual emission display panel. One pixel 850 is shown in FIG. 8B. The pixel 850 comprises a subpixel 817 including the light emitting element 825 and a subpixel 849 including a photoelectric converter 838. The subpixel 817 comprises a signal line 820, a power supply line 821, a scan line 822, a switching transistor 823 for controlling a video signal input, and a driving transistor 824 for supplying to the light emitting element 825 a current corresponding to the input video signal. It is to be noted that the configuration of the subpixel 817 can also be applied to a typical circuit configuration in a cross section of the transistor and the light emitting element shown in FIG. 8A.

On the other hand, the subpixel 849 comprises a signal line 840, scan lines 842 and 843, a reset transistor 846 for resetting a potential difference between two electrodes of the photoelectric converter 838, an amplifier transistor 845 in which a current corresponding to the potential difference between the two electrodes of the photoelectric converter 838 is supplied between the source and drain thereof, and a switching transistor 844 for controlling an input of a signal which is read from the photoelectric converter 838 to driving circuits.

It is to be noted that the active light emitting element and the photoelectric converter are formed over the same substrate in this embodiment, though the passive light emitting element and the photoelectric converter as shown in FIG. 10B may be formed over the same substrate. Further, although each pixel comprises the light emitting element 825 and the photoelectric converter 838 in this embodiment, the photoelectric converter 838 is not necessarily provided in each pixel, and may be provided every several pixels in accordance with an object to be read or usage of the portable terminal. Accordingly, the open area ratio of the light emitting element 825 is increased, thus bright images can be achieved.

This embodiment can be implemented in combination with other embodiments.

Embodiment 10

Figure 14:
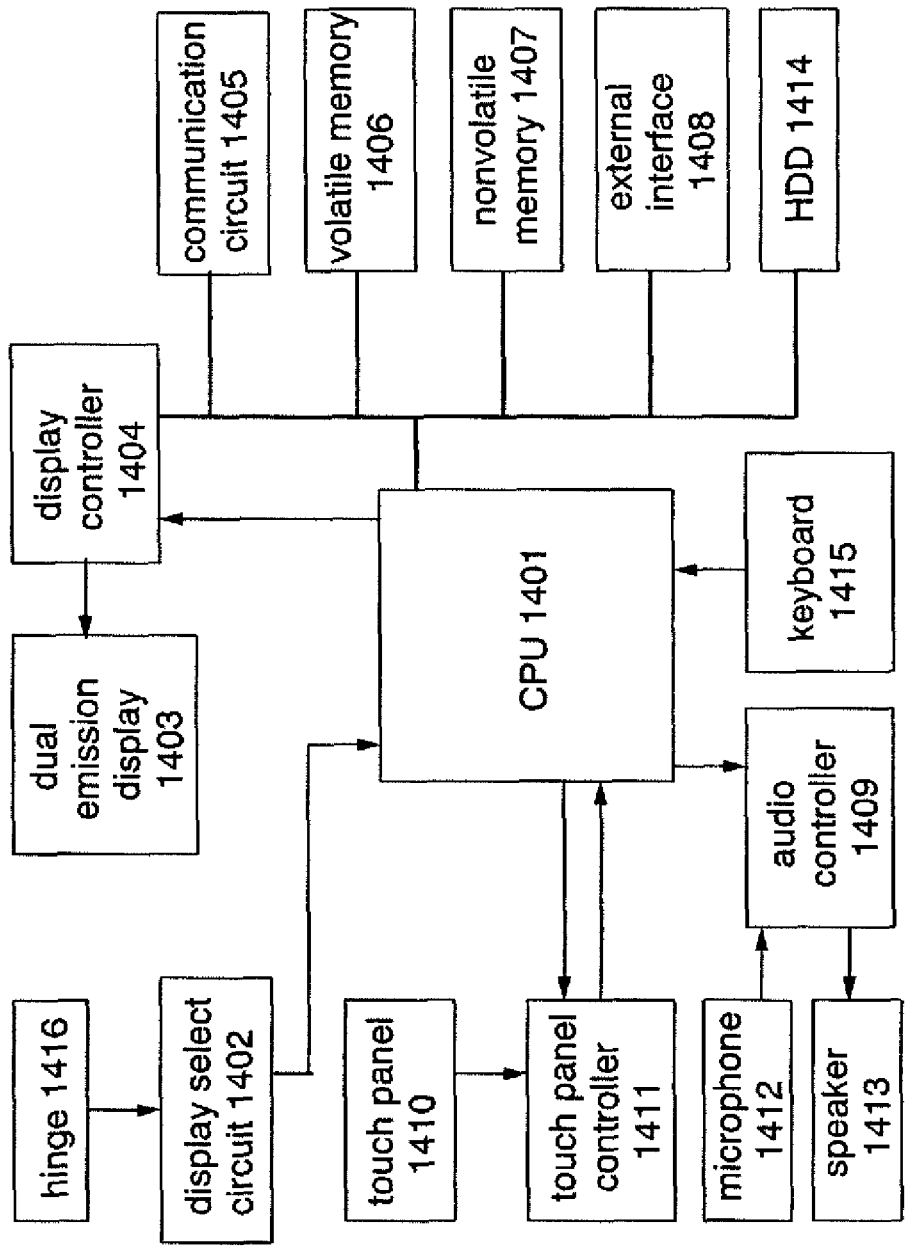
FIG. 14 is a block diagram of an electronic apparatus using the invention.

FIG. 14 is a block diagram of a tablet PC using the invention. The tablet PC in this embodiment corresponds to the one described in Embodiment Mode. The tablet PC in this embodiment comprises a CPU 1401, a HDD 1414, a keyboard 1415, an external interface 1408, a nonvolatile memory 1407, a volatile memory 1406, a communication circuit 1405, a microphone 1412, a speaker 1413, an audio controller 1409, a touch panel 1410, a touch panel controller 1411, a display controller 1404, a dual emission display 1403, and a display select circuit 1402. The dual emission display 1403 in this embodiment has to be changed the scan direction and images to be displayed depending on a used display surface.

In view of the foregoing, the invention provides a structure for selecting a display surface by detecting the angle of a hinge 1416 which connects a first housing with a second housing. When the hinge 1416 is in open position (when using the keyboard 1415), images corresponding to a main display are output. That is, the display select circuit 1402 detects the angle data of the hinge 1416 and sends the data to the CPU 1401. Then, the CPU 1401 instructs the display controller 1404 to send data for the main display to the dual emission display 1403.

When the hinge 1416 is in closed position (when using a touch pen), images corresponding to a sub-display are output. That is, the display select circuit 1402 detects the angle data of the hinge 1416 and sends the data to the CPU 1401. Then, the CPU 1401 instructs the display controller 1404 to send data for the sub-display to the dual emission display 1403. In such a manner, the display surface can be changed.

Embodiment 11

In this embodiment, another embodiment of a dual emission display panel used for the portable terminal of the invention is explained with reference to FIGS. 17A to 17C. In FIGS. 17A and 17B, reference numerals 1701 and 1702 denote polarizers, and 1703 denotes a dual emission display panel. FIG. 17A is a front elevational view and FIG. 17B is a side elevational view. In this embodiment, the dual emission display panel 1703 is interposed between the polarizers 1701 and 1702. The two polarizers are arranged so that their polarization directions cross each other, thus outside light can be cut off. The crossing angle between the two polarization directions is in the range of 40 to 90 degrees, preferably from 70 to 90 degrees, and if possible, at 90 degrees. Light from the dual emission display panel 1703 transmits through either of the two polarizers to display an image. Accordingly, a black display is performed in the region in which no light is emitted and no image is displayed. Thus, the far side of the dual emission display panel is not transmitted in viewing from either side.

Either or both of the polarizers 1701 and 1702 may be rotatable, and the transmittance of the dual emission display panel can be changed by changing the crossing angle. That is, a brightness control function may be additionally provided.

An antireflective coating or an antireflective film may be provided outside the polarizers 1701 and 1702 in order to reduce the reflectance, and thereby improve the visual quality. Otherwise, a half-wave plate or a quarter-wave plate (or the relevant films) may be added. In this manner, an added film having an optical function allows to enhance the visual quality and in particular, to perform a black display more clearly.

This embodiment can be implemented in combination with other embodiments.

Embodiment 12

Figure 22:
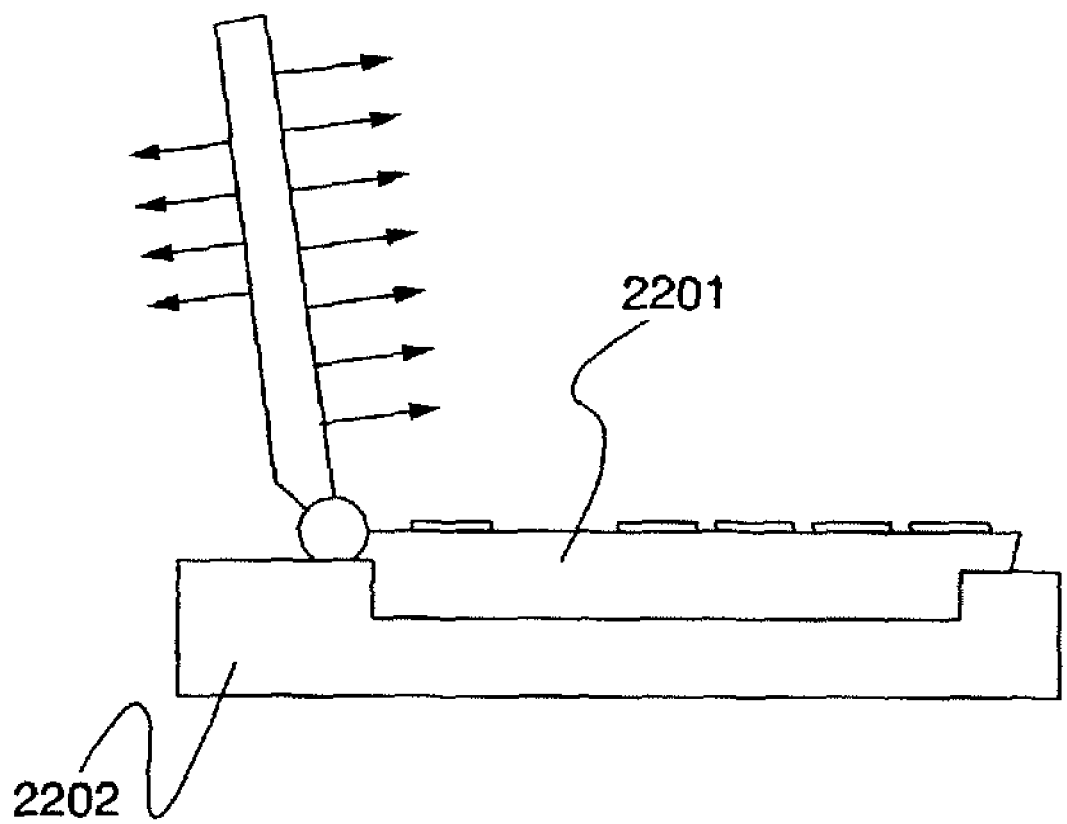
FIG. 22 shows an electronic apparatus using the invention during charging.

FIG. 22 shows a portable telephone set using the display device of the invention, which is charging. In FIG. 22, a portable telephone set 2201 is charged in open position by using a battery charger 2202, and display portions emit light on both sides of the portable telephone set 2201. The portable telephone set 2201 may also be charged in closed position. Generally in a display device using a light emitting element, a light emitting element deteriorates over time, and the brightness is decreased. In the case of a display device having a light emitting element in each pixel, in particular, lighting frequency of pixel is different by location, thus degree of deterioration varies by location. Therefore, a higher lightning frequency causes a pixel to deteriorate quickly and image persistence which decreases the image quality. In order to alleviate image persistence, an image is displayed during charging and the like, in which the portable telephone set is not used normally, and a pixel less frequently used is lighted. As for an image displayed during charging, used are an image displayed by lighting all the pixels, an image obtained by inverting contrast of normal screen (idle screen, for example), an image displayed by detecting pixels less frequently used, and the like.

Figure 20:
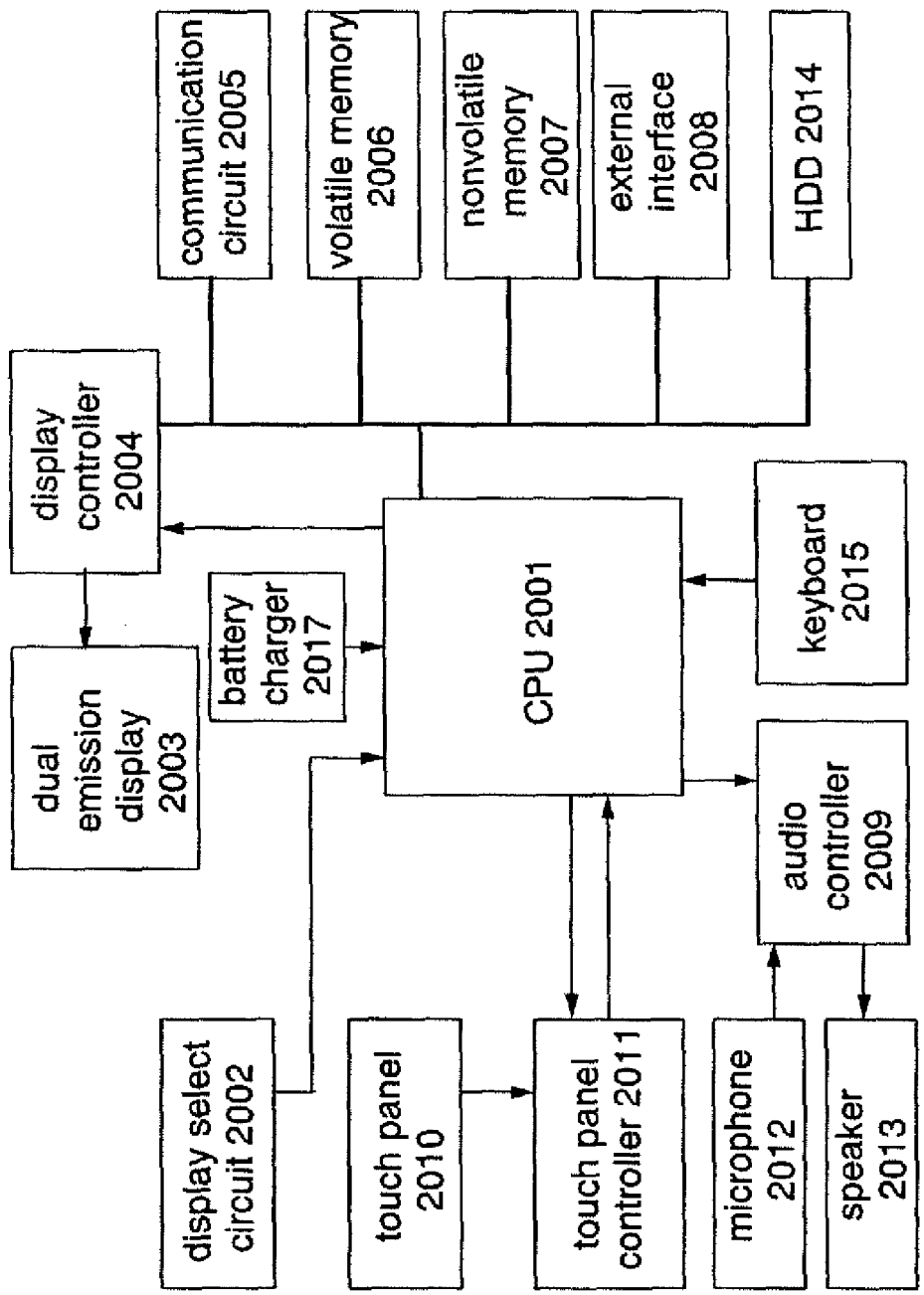
FIG. 20 is a block diagram of an electronic apparatus using the invention.

FIG. 20 is a block diagram corresponding to FIG. 22. In this embodiment, the portable telephone set 2201 comprises a CPU 2001, a HDD 2014, a keyboard 2015, an external interface 2008, a nonvolatile memory 2007, a volatile memory 2006, a communication circuit 2005, a microphone 2012, a speaker 2013, an audio controller 2009, a touch panel 2010, a touch panel controller 2011, a display controller 2004, a dual emission display 2003, and a display select circuit 2002. A battery charger 2017 detects a signal showing a charge status and sends the signal to the CPU 2001. Then, the CPU 2001 instructs the display controller 2004 to display the corresponding signal, thus the dual emission display 2003 emits light.

Figure 21:
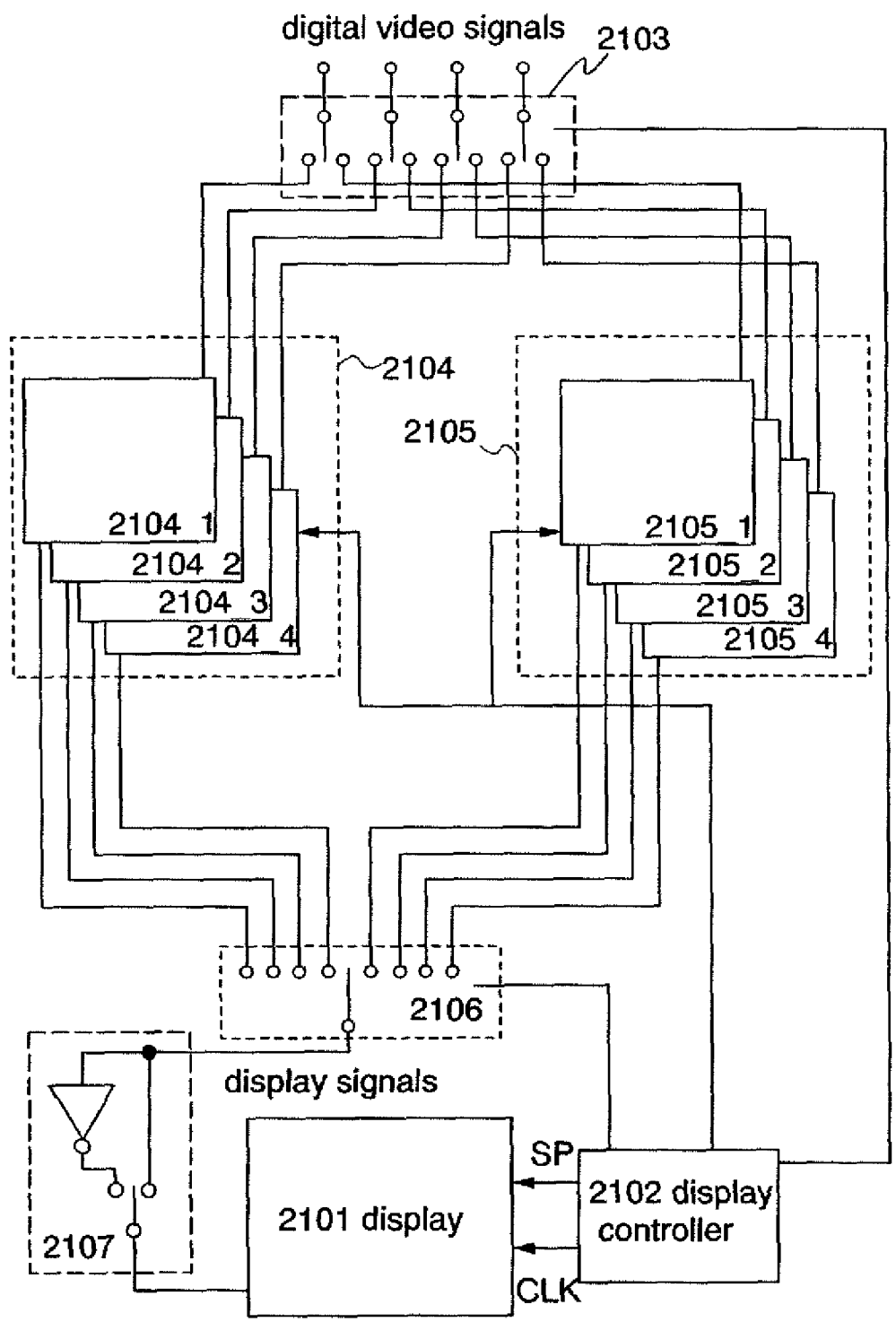
FIG. 21 is a block diagram of a display controller.

FIG. 21 shows an example of a controller for producing the above-described image whose contrast is inverted from that of normal display screen. An output signal from an image signal select switch 2106 is input to a switch 2107. A display controller 2102 determines whether the output signal from the image signal select switch 2106 is input directly to a display 2101 or input after being inverted. When contrast has to be inverted, the signal may be input after being inverted. A switch 2103, a memory A 2104 and a memory B 2105 in FIG. 21 function as a switch 903, a memory A 904 and a memory B 905 in FIG. 9, respectively. In the case of displaying an image using all the pixels lighted, a constant voltage may be input to the display 2101 (not shown).

In such a manner, deterioration of visual quality can be prevented by emitting light during charging so as to alleviate image persistence. This embodiment can be implemented in combination with other embodiments.

Embodiment 13

Figure 23:
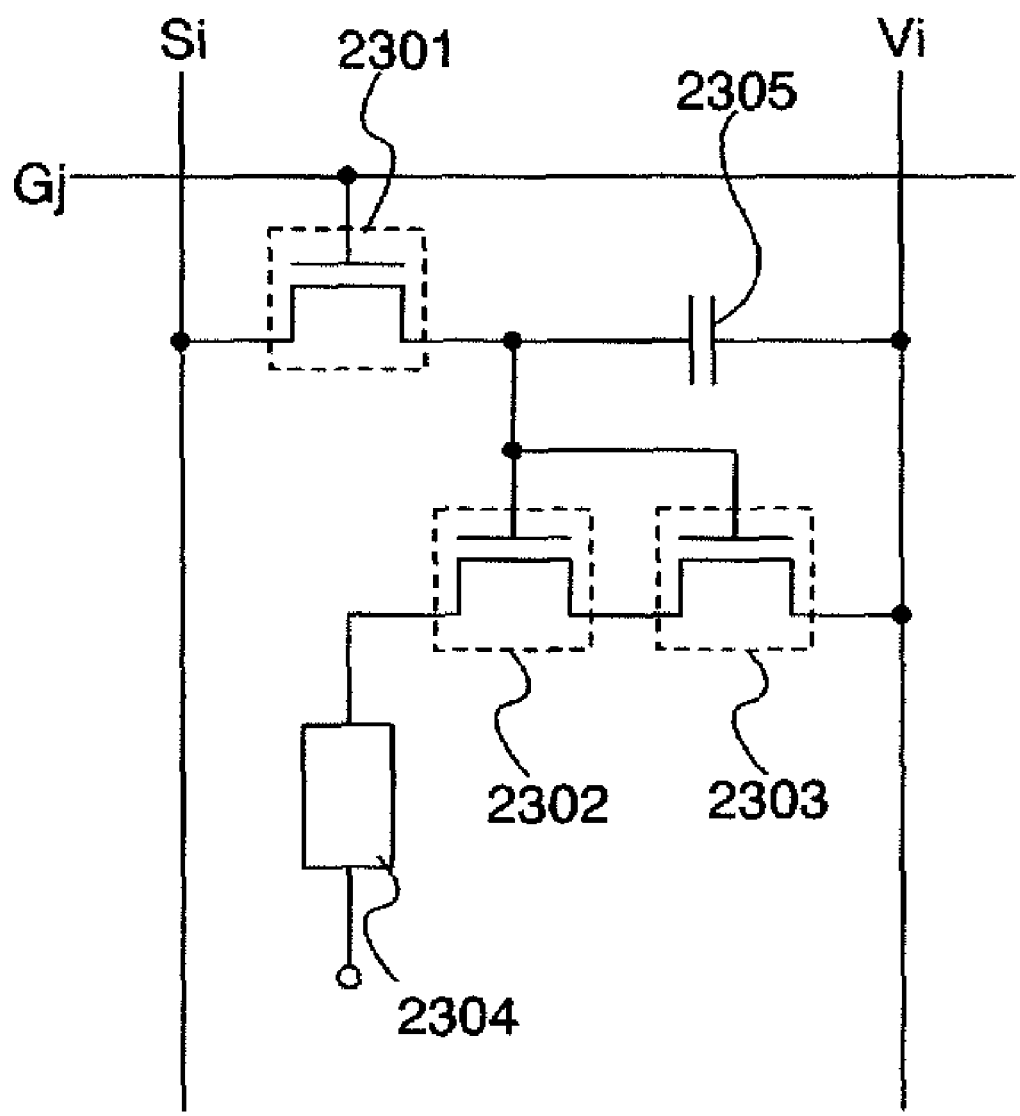
FIG. 23 shows an example of a pixel circuit using the invention.

Another example of pixel applied to the invention will be explained with reference to FIGS. 23 and 24. A pixel shown in a circuit diagram of FIG. 23 comprises a light emitting element 2304, a switching transistor 2301 for controlling a video signal input to the pixel, and transistors 2302 and 2303 for controlling current supply to the light emitting element 2304. In this embodiment, the transistor 2302 corresponds to a driving transistor, and the transistor 2303 corresponds to a current control transistor. A capacitor 2305 for storing a video signal potential may be additionally provided in the pixel as in Embodiment Mode of the invention.

The driving transistor 2302 and the current control transistor 2303 have the same conductivity. Both of them have P-type conductivity in this embodiment, though they may have N-type conductivity. A threshold voltage of the driving transistor 2302 is set higher than that of the current control transistor 2303, and more preferably, the driving transistor 2302 is to be a normally-ON transistor. Further, in the invention, the ratio of the channel length to the channel width (L/W) of the driving transistor 2302 is larger than that of the current control transistor 2303, thereby the driving transistor 2302 is operated in saturation region and the current control transistor 2302 is operated in linear region. Specifically, in the driving transistor 2302, the channel length (L) is set longer, preferably five times longer or more, than the channel width (W). Meanwhile, in the current control transistor 2303, the channel length (L) is set equal to or shorter than the channel width (W).

The gate of the switching transistor 2301 is connected to a scan line Gj (j=1 to y). One of the source and drain of the switching transistor 2301 is connected to a signal line Si (i=1 to x) and the other is connected to the gate of the driving transistor 2302 and the gate of the current control transistor 2303. The driving transistor 2302 and the current control transistor 2303 are connected in series. The driving transistor 2302 and the current control transistor 2303 are connected to a power supply line Vi (i=1 to x) and the light emitting element 2304 so that a current from the power supply line Vi is supplied to the light emitting element 2304 as a drain current of the driving transistor 2302 and of the current control transistor 2303. In this embodiment, the source of the current control transistor 2303 is connected to the power supply line Vi (i=1 to x), and the drain of the driving transistor 2302 is connected to a pixel electrode of the light emitting element 2304.

The light emitting element 2304 comprises an anode, a cathode and an electro luminescent layer interposed between the anode and the cathode. When the anode is connected to either the driving transistor 2302 or the current control transistor 2303, the anode is used as a pixel electrode and the cathode is a counter electrode. Meanwhile, when the cathode is connected to either the driving transistor 2302 or the current control transistor 2303, the cathode is used as a pixel electrode and the anode is a counter electrode. A voltage is supplied from a power supply to each of the counter electrode of the light emitting element 2304 and the power supply line Vi so as to supply a forward bias current to the light emitting element 2304.

One of the two electrodes of the capacitor 2305 is connected to the power supply line Vi and the other is connected to the gates of the driving transistor 2302 and the current control transistor 2303. The capacitor 2305 is provided to store the gate voltage of the driving transistor 2302 and of the current control transistor 2303, when the switching transistor 2301 is turned OFF. Although the capacitor 2305 is provided in FIG. 23, the invention is not exclusively limited to this configuration, and the capacitor is not necessarily provided.

In the case where the source or the drain of the driving transistor 2302 is connected to the anode of the light emitting element 2304, it is desirable that the driving transistor 2302 has P-type conductivity. On the other hand, in the case where the source or the drain of the driving transistor 2302 is connected to the cathode of the light emitting element 2304, it is desirable that the driving transistor 2302 has N-type conductivity.

Figure 24:
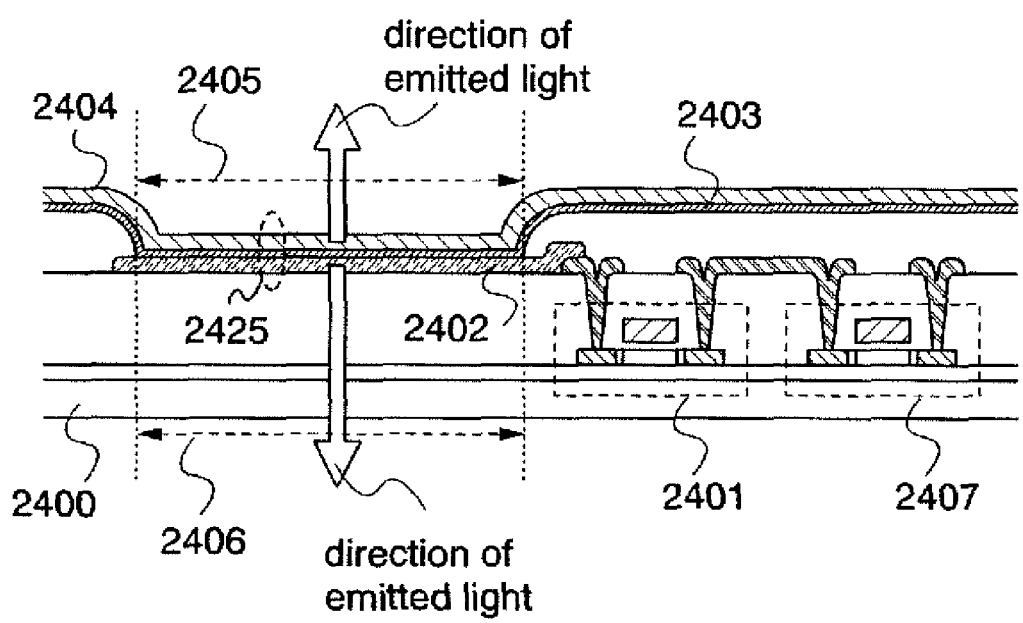
FIG. 24 shows a dual emission display panel using the invention.

With reference to FIG. 24, explanation will be made on a structure of a dual emission display panel which includes first and second display surfaces and uses the pixel circuit shown in FIG. 23. In FIG. 24, a driving transistor 2401, a current control transistor 2407, a first electrode (pixel electrode) 2402, a light emitting layer 2403, and a second electrode (counter electrode) 2404 are provided over a light transmissive substrate 2400. The driving transistor 2401 is formed so as to be a normally-ON transistor. For example, elements such as boron, which imparts one conductivity, is added in a channel forming region by ion implantation or ion doping.

A light emitting element 2425 is formed by laminating the first electrode 2402, the light emitting layer 2403 and the second electrode 2404. In this embodiment, the first electrode 2402 and the second electrode 2404 are formed of a light transmissive material. Accordingly, the light emitting element 2425 emits light in the direction of the substrate 2400 (first direction) and the opposite direction thereof (second direction), and comprises a first display region 2405 and a second display region 2406. It is to be noted that for a light transmissive material for the first electrode 2402 and the second electrode 2404, used are aluminum having a thickness enough to transmit light, or a light transmissive conductive film such as indium tin oxide, zinc oxide, or indium tin oxide added with silicon oxide, gallium, zinc oxide, tungsten oxide and the like.

This embodiment can be implemented in combination with other embodiments.

What is claimed is:

1. An electronic apparatus comprising:
a first housing and a second housing which are connected to each other so as to be used both in open position and closed position;
display means having a light emitting element formed over a light transmissive substrate mounted in the first housing, which emits light from the light emitting element to the light transmissive substrate side and the opposite side thereof so as to form a first display surface and a second display surface;
detecting means for detecting a signal corresponding to an angle between the first housing and the second housing; and
switching means for changing a scan direction of the display means in accordance with the signal output from the detecting means.

2. The electronic apparatus according to claim 1, wherein the electronic apparatus is a personal computer.

3. The electronic apparatus according to claim 1, wherein the electronic apparatus is a video camera.

4. The electronic apparatus according to claim 1, wherein the electronic apparatus is a digital camera.

5. The electronic apparatus according to claim 1, wherein the electronic apparatus is a portable communication tool.

6. The electronic apparatus according to claim 1, wherein the electronic apparatus comprises an electrical storage, and light emission control means for lighting a display screen when the electrical storage is charged.

7. The electronic apparatus according to claim 6, wherein the light emission control means comprises a recording medium on which is recorded a control program for lighting the display screen.

8. The electronic apparatus according to claim 6, wherein the light emission control means comprises a recording medium on which is recorded a control program for lighting an inverted display screen whose contrast is inverted from that of a normal display screen.

9. The electronic apparatus according to claim 6, wherein the light emission control means comprises a recording medium on which is recorded a control program for lighting a pixel which is less in deterioration.

* * * * *

UNITED STATES PATENT AND TRADEMARK OFFICE
CERTIFICATE OF CORRECTION

| | | |
|---|---|---|
| PATENT NO. | : 8,009,145 B2 | Page 1 of 1 |
| APPLICATION NO. | : 11/969232 | |
| DATED | : August 30, 2011 | |
| INVENTOR(S) | : Shunpei Yamazaki | |

It is certified that error appears in the above-identified patent and that said Letters Patent is hereby corrected as shown below:

Sheet 1 of 24, Figure 1A, insert the numeral --105-- on the right side of the figure.
Column 7, line 46, replace "line G1, when" with --line G1. When--.
Column 8, line 48, replace "period Te when" with --period Te. When--.
Column 9, line 34, replace "tool sing the" with --tool using the--.

Signed and Sealed this
Seventh Day of February, 2012

David J. Kappos
*Director of the United States Patent and Trademark Office*